(12) United States Patent
Kenny et al.

(10) Patent No.: US 7,017,654 B2
(45) Date of Patent: Mar. 28, 2006

(54) APPARATUS AND METHOD OF FORMING CHANNELS IN A HEAT-EXCHANGING DEVICE

(75) Inventors: Thomas Kenny, San Carlos, CA (US); Mark McMaster, Menlo Park, CA (US); James Lovette, San Francisco, CA (US)

(73) Assignee: Cooligy, Inc., Mountain View, CA (US)

( * ) Notice: Subject to any disclaimer, the term of this patent is extended or adjusted under 35 U.S.C. 154(b) by 91 days.

(21) Appl. No.: 10/643,684

(22) Filed: Aug. 18, 2003

(65) Prior Publication Data

US 2004/0182560 A1 Sep. 23, 2004

Related U.S. Application Data

(60) Provisional application No. 60/455,729, filed on Mar. 17, 2003.

(51) Int. Cl.
*F28F 7/00* (2006.01)

(52) U.S. Cl. .............. 165/80.4; 165/185; 165/104.33; 361/699; 257/714; 174/15.1

(58) Field of Classification Search ............... 165/185, 165/905, 137.1, 133; 29/890.03; 361/704, 361/706, 708; 257/750–766
See application file for complete search history.

(56) References Cited

U.S. PATENT DOCUMENTS

| | | |
|---|---|---|
| 596,062 A | 12/1897 | Firey |
| 2,039,593 A | 5/1936 | Hubbuch et al. |
| 2,273,505 A | 2/1942 | Florian |
| 3,361,195 A | 1/1968 | Meyerhoff et al. |
| 3,654,988 A | 4/1972 | Clayton, III |
| 3,771,219 A | 11/1973 | Tuzi et al. |

(Continued)

FOREIGN PATENT DOCUMENTS

| | | |
|---|---|---|
| CN | 97212126.9 | 3/1997 |
| JP | 1-256775 | 10/1989 |
| JP | 10-99592 | 4/1998 |
| JP | 2000-277540 | 10/2000 |
| JP | 2001-326311 | 11/2001 |

OTHER PUBLICATIONS

Stephen C. Jacobson et al., "Fused Quartz Substrates for Microchip Electrophoresis", Analytical Chemistry, Vo. 67, No. 13, Jul. 1, 1995, pp. 2059–2063.
Kendra V. Sharp et al., "Liquid Flows in Microchannels", 2002, vol. 6, pp. 6–1 to 6–38.
Shuchi Shoji et al., "Microflow devices and systems,", J. Microcech. Microeng. 4 (1994), pp. 157–171, printed in the U.K.
Angela Rasmussen et al., "Fabrication Techniques to Realize CMOS–Compatible Microfluidic Microchannels", Journal of Microelectromechanical, Vo. 10, No. 2, Jun. 2001, pp. 286–297.

(Continued)

*Primary Examiner*—Terrell Mckinnon
(74) *Attorney, Agent, or Firm*—Haverstock & Owens LLP

(57) ABSTRACT

An apparatus and method of manufacturing an apparatus for circulating a cooling material within a heat exchanger is disclosed. The apparatus comprises a manifold layer and an interface layer. The interface layer comprises one or more narrowing trenches. The manifold layer comprises a plurality of apertures, each positioned on either side of a narrowing trench. In operation, a cooling material is transmitted to an apertures, through a channel defined by the narrowing trench and a bottom surface of the manifold layer, and out an aperture, thereby cooling a heat-generating source coupled to a bottom surface of the interface layer. The method comprises forming a narrowing trench in an interface layer, which exhibits anisotropic etching, by etching the interface layer to form a trench having sloping sidewalls. The method further comprises coupling the interface layer to a manifold layer.

56 Claims, 13 Drawing Sheets

U.S. PATENT DOCUMENTS

| | | | |
|---|---|---|---|
| 3,817,321 A | 6/1974 | von Cube et al. | |
| 3,823,572 A | 7/1974 | Cochran, Jr. | |
| 3,923,426 A | 12/1975 | Theeuwes | |
| 3,929,154 A | 12/1975 | Goodwin | |
| 3,948,316 A | 4/1976 | Souriau | |
| 4,109,707 A | 8/1978 | Wilson et al. | |
| 4,138,996 A | 2/1979 | Cartland | |
| 4,194,559 A | 3/1980 | Eastman | |
| 4,211,208 A | 7/1980 | Lindner | |
| 4,248,295 A | 2/1981 | Ernst et al. | |
| 4,312,012 A | 1/1982 | Frieser et al. | |
| 4,450,472 A | 5/1984 | Tuckerman et al. | |
| 4,467,861 A | 8/1984 | Kiseev et al. | |
| 4,485,429 A | 11/1984 | Mittal | |
| 4,516,632 A | 5/1985 | Swift et al. | |
| 4,540,115 A | 9/1985 | Hawrylo | |
| 4,561,040 A | 12/1985 | Eastman et al. | |
| 4,567,505 A | 1/1986 | Pease et al. | |
| 4,573,067 A | 2/1986 | Tuckerman et al. | |
| 4,574,876 A | 3/1986 | Aid | |
| 4,644,385 A | 2/1987 | Nakanishi et al. | |
| 4,664,181 A | 5/1987 | Sumberg | |
| 4,758,926 A | 7/1988 | Herrell et al. | |
| 4,866,570 A | 9/1989 | Porter | |
| 4,868,712 A | 9/1989 | Woodman | |
| 4,893,174 A | 1/1990 | Yamada et al. | |
| 4,894,709 A | 1/1990 | Phillips et al. | |
| 4,896,719 A | 1/1990 | O'Neill et al. | |
| 4,903,761 A | 2/1990 | Cima | |
| 4,908,112 A | 3/1990 | Pace | |
| 4,938,280 A | 7/1990 | Clark | |
| 5,009,760 A | 4/1991 | Zare et al. | |
| 5,016,090 A * | 5/1991 | Galyon et al. | 257/714 |
| 5,016,138 A | 5/1991 | Woodman | |
| 5,043,797 A | 8/1991 | Lopes | |
| 5,057,908 A | 10/1991 | Weber | |
| 5,058,627 A | 10/1991 | Brannen | |
| 5,070,040 A | 12/1991 | Pankove | |
| 5,083,194 A | 1/1992 | Bartilson | |
| 5,088,005 A | 2/1992 | Ciaccio | |
| 5,096,388 A | 3/1992 | Weinberg | |
| 5,099,311 A | 3/1992 | Bonde et al. | |
| 5,099,910 A | 3/1992 | Walpole et al. | |
| 5,125,451 A | 6/1992 | Matthews | |
| 5,131,233 A | 7/1992 | Cray et al. | |
| 5,161,089 A | 11/1992 | Chu et al. | |
| 5,179,500 A | 1/1993 | Koubek et al. | 361/385 |
| 5,203,401 A | 4/1993 | Hamburgen et al. | |
| 5,218,515 A | 6/1993 | Bernhardt | |
| 5,219,278 A | 6/1993 | van Lintel | |
| 5,228,502 A * | 7/1993 | Chu et al. | 165/80.4 |
| 5,232,047 A | 8/1993 | Matthews | |
| 5,239,200 A | 8/1993 | Messina et al. | |
| 5,239,443 A * | 8/1993 | Fahey et al. | 361/689 |
| 5,263,251 A | 11/1993 | Matthews | |
| 5,265,670 A | 11/1993 | Zingher | |
| 5,269,372 A * | 12/1993 | Chu et al. | 165/80.4 |
| 5,274,920 A | 1/1994 | Matthews | |
| 5,275,237 A | 1/1994 | Rolfson et al. | |
| 5,308,429 A | 5/1994 | Bradley | |
| 5,309,319 A | 5/1994 | Messina | |
| 5,310,440 A * | 5/1994 | Zingher | 156/345.11 |
| 5,316,077 A | 5/1994 | Reichard | |
| 5,317,805 A | 6/1994 | Hoopman et al. | |
| 5,325,265 A | 6/1994 | Turlik et al. | |
| 5,336,062 A | 8/1994 | Richter | |
| 5,346,000 A | 9/1994 | Schlitt | |
| 5,380,956 A | 1/1995 | Loo et al. | |
| 5,383,340 A | 1/1995 | Larson et al. | |
| 5,386,143 A | 1/1995 | Fitch | |
| 5,388,635 A * | 2/1995 | Gruber et al. | 165/80.4 |
| 5,421,943 A | 6/1995 | Tam et al. | |
| 5,427,174 A | 6/1995 | Lomolino, Sr. et al. | |
| 5,436,793 A | 7/1995 | Sanwo et al. | |
| 5,459,099 A | 10/1995 | Hsu | |
| 5,490,117 A | 2/1996 | Oda et al. | |
| 5,508,234 A | 4/1996 | Dusablon, Sr. et al. | |
| 5,514,832 A | 5/1996 | Dusablon, Sr. et al. | |
| 5,514,906 A | 5/1996 | Love et al. | |
| 5,544,696 A | 8/1996 | Leland | |
| 5,548,605 A * | 8/1996 | Benett et al. | 372/36 |
| 5,575,929 A | 11/1996 | Yu et al. | |
| 5,579,828 A | 12/1996 | Reed et al. | |
| 5,585,069 A | 12/1996 | Zanzucchi et al. | |
| 5,641,400 A | 6/1997 | Kaltenbach et al. | |
| 5,658,831 A | 8/1997 | Layton et al. | |
| 5,675,473 A | 10/1997 | McDunn et al. | |
| 5,692,558 A | 12/1997 | Hamilton et al. | |
| 5,696,405 A | 12/1997 | Weld | |
| 5,703,536 A | 12/1997 | Davis et al. | |
| 5,704,416 A | 1/1998 | Larson et al. | |
| 5,727,618 A | 3/1998 | Mundinger et al. | |
| 5,740,013 A | 4/1998 | Roesner et al. | |
| 5,759,014 A | 6/1998 | Van Lintel | |
| 5,763,951 A | 6/1998 | Hamilton et al. | |
| 5,768,104 A | 6/1998 | Salmonson et al. | |
| 5,774,779 A | 6/1998 | Tuchinskiy | |
| 5,800,690 A | 9/1998 | Chow et al. | |
| 5,801,442 A | 9/1998 | Hamilton et al. | |
| 5,835,345 A | 11/1998 | Staskus et al. | |
| 5,836,750 A | 11/1998 | Cabuz | |
| 5,858,188 A | 1/1999 | Soane et al. | |
| 5,863,708 A | 1/1999 | Zanzucchi et al. | |
| 5,869,004 A | 2/1999 | Parce et al. | |
| 5,870,823 A | 2/1999 | Bezama et al. | |
| 5,874,795 A | 2/1999 | Sakamoto | |
| 5,876,655 A | 3/1999 | Fisher | |
| 5,880,017 A | 3/1999 | Schwiebert et al. | |
| 5,880,524 A | 3/1999 | Xie | |
| 5,901,037 A | 5/1999 | Hamilton et al. | |
| 5,921,087 A | 7/1999 | Bhatia et al. | |
| 5,936,192 A | 8/1999 | Tauchi | |
| 5,940,270 A | 8/1999 | Puckett | |
| 5,942,093 A | 8/1999 | Rakestraw et al. | |
| 5,945,217 A | 8/1999 | Hanrahan | |
| 5,964,092 A | 10/1999 | Tozuka et al. | |
| 5,965,001 A | 10/1999 | Chow et al. | |
| 5,965,813 A | 10/1999 | Wan et al. | |
| 5,978,220 A | 11/1999 | Frey et al. | |
| 5,993,750 A | 11/1999 | Ghosh et al. | |
| 5,997,713 A | 12/1999 | Beetz, Jr. et al. | |
| 5,998,240 A * | 12/1999 | Hamilton et al. | 438/122 |
| 6,007,309 A | 12/1999 | Hartley | |
| 6,010,316 A | 1/2000 | Haller et al. | |
| 6,013,164 A | 1/2000 | Paul et al. | |
| 6,014,312 A | 1/2000 | Schulz-Harder et al. | |
| 6,019,165 A | 2/2000 | Batchelder | |
| 6,019,882 A | 2/2000 | Paul et al. | |
| 6,034,872 A | 3/2000 | Chrysler et al. | |
| 6,039,114 A | 3/2000 | Becker et al. | |
| 6,054,034 A | 4/2000 | Soane et al. | |
| 6,068,752 A | 5/2000 | Dubrow et al. | |
| 6,090,251 A | 7/2000 | Sundberg et al. | |
| 6,096,656 A | 8/2000 | Matzke et al. | |
| 6,100,541 A | 8/2000 | Nagle et al. | |
| 6,101,715 A | 8/2000 | Fuesser et al. | |
| 6,119,729 A | 9/2000 | Oberholzer et al. | |
| 6,126,723 A | 10/2000 | Drost et al. | |
| 6,129,145 A | 10/2000 | Yamamoto et al. | |
| 6,129,260 A | 10/2000 | Andrus et al. | |
| 6,131,650 A | 10/2000 | North et al. | |

| | | |
|---|---|---|
| 6,140,860 A | 10/2000 | Sandhu et al. |
| 6,146,103 A | 11/2000 | Lee et al. |
| 6,154,363 A | 11/2000 | Chang |
| 6,159,353 A | 12/2000 | West et al. |
| 6,167,948 B1 | 1/2001 | Thomas |
| 6,171,067 B1 | 1/2001 | Parce |
| 6,174,675 B1 | 1/2001 | Chow et al. |
| 6,176,962 B1 | 1/2001 | Soane et al. |
| 6,186,660 B1 | 2/2001 | Kopf-Sill et al. |
| 6,206,022 B1 * | 3/2001 | Tsai et al. ................ 137/15.18 |
| 6,210,986 B1 | 4/2001 | Arnold et al. |
| 6,216,343 B1 | 4/2001 | Leland et al. |
| 6,227,809 B1 | 5/2001 | Forster et al. |
| 6,234,240 B1 | 5/2001 | Cheon |
| 6,238,538 B1 | 5/2001 | Parce et al. |
| 6,253,832 B1 | 7/2001 | Hallefalt |
| 6,253,835 B1 | 7/2001 | Chu et al. |
| 6,257,320 B1 | 7/2001 | Wargo |
| 6,277,257 B1 | 8/2001 | Paul et al. |
| 6,287,440 B1 | 9/2001 | Arnold et al. |
| 6,301,109 B1 | 10/2001 | Chu et al. |
| 6,313,992 B1 | 11/2001 | Hildebrandt |
| 6,317,326 B1 | 11/2001 | Vogel et al. |
| 6,321,791 B1 | 11/2001 | Chow |
| 6,322,753 B1 | 11/2001 | Lindberg et al. |
| 6,324,058 B1 | 11/2001 | Hsiao |
| 6,330,907 B1 | 12/2001 | Ogushi et al. |
| 6,336,497 B1 | 1/2002 | Lin |
| 6,337,794 B1 | 1/2002 | Agonafer et al. |
| 6,351,384 B1 | 2/2002 | Daikoku et al. |
| 6,366,462 B1 | 4/2002 | Chu et al. |
| 6,366,467 B1 | 4/2002 | Patel et al. |
| 6,367,544 B1 | 4/2002 | Calaman |
| 6,388,317 B1 | 5/2002 | Reese |
| 6,396,706 B1 | 5/2002 | Wohlfarth |
| 6,397,932 B1 | 6/2002 | Calaman et al. |
| 6,400,012 B1 | 6/2002 | Miller et al. |
| 6,406,605 B1 | 6/2002 | Moles |
| 6,415,860 B1 | 7/2002 | Kelly et al. |
| 6,416,642 B1 | 7/2002 | Alajoki et al. |
| 6,417,060 B1 | 7/2002 | Tavkhelidze et al. |
| 6,424,531 B1 | 7/2002 | Bhatti et al. |
| 6,431,260 B1 | 8/2002 | Agonafer et al. |
| 6,437,981 B1 | 8/2002 | Newton et al. |
| 6,438,984 B1 | 8/2002 | Novotny et al. |
| 6,443,222 B1 | 9/2002 | Yun et al. |
| 6,444,461 B1 | 9/2002 | Knapp et al. |
| 6,457,515 B1 | 10/2002 | Vafai et al. |
| 6,459,581 B1 | 10/2002 | Newton et al. |
| 6,466,442 B1 | 10/2002 | Lin |
| 6,477,045 B1 | 11/2002 | Wang |
| 6,492,200 B1 | 12/2002 | Park et al. |
| 6,495,015 B1 | 12/2002 | Schoeniger et al. |
| 6,519,151 B1 * | 2/2003 | Chu et al. ................ 361/699 |
| 6,533,029 B1 | 3/2003 | Phillips |
| 6,536,516 B1 | 3/2003 | Davies et al. |
| 6,537,437 B1 | 3/2003 | Galambos et al. |
| 6,543,521 B1 | 4/2003 | Sato et al. |
| 6,553,253 B1 | 4/2003 | Chang |
| 6,572,749 B1 | 6/2003 | Paul et al. |
| 6,578,626 B1 | 6/2003 | Calaman et al. |
| 6,581,388 B1 | 6/2003 | Novotny et al. |
| 6,587,343 B1 | 7/2003 | Novotny et al. |
| 6,588,498 B1 | 7/2003 | Bhatti et al. |
| 6,591,625 B1 | 7/2003 | Simon |
| 6,600,220 B1 | 7/2003 | Barber et al. |
| 6,601,643 B1 | 8/2003 | Cho et al. |
| 6,606,251 B1 | 8/2003 | Kenny, Jr. et al. |
| 6,609,560 B1 | 8/2003 | Cho et al. |
| 6,632,655 B1 | 10/2003 | Mehta et al. |
| 6,632,719 B1 * | 10/2003 | DeBoer et al. ............. 438/381 |
| 6,651,735 B1 | 11/2003 | Cho et al. |
| 6,729,383 B1 | 5/2004 | Cannell et al. |
| 6,743,664 B1 | 6/2004 | Liang et al. |
| 2001/0016985 A1 | 8/2001 | Insley et al. |
| 2001/0024820 A1 | 9/2001 | Mastromatteo et al. |
| 2001/0044155 A1 | 11/2001 | Paul et al. |
| 2001/0045270 A1 | 11/2001 | Bhatti et al. |
| 2001/0046703 A1 | 11/2001 | Burns et al. |
| 2001/0055714 A1 | 12/2001 | Cettour-Rose et al. |
| 2002/0011330 A1 | 1/2002 | Insley et al. |
| 2002/0075645 A1 | 6/2002 | Kitano et al. |
| 2002/0121105 A1 | 9/2002 | McCarthy, Jr. et al. |
| 2002/0134543 A1 | 9/2002 | Estes et al. |
| 2003/0062149 A1 | 4/2003 | Goodson et al. |
| 2003/0121274 A1 | 7/2003 | Wightman |
| 2003/0213580 A1 | 11/2003 | Philpott et al. |
| 2004/0040695 A1 | 3/2004 | Chesser et al. |
| 2004/0052049 A1 | 3/2004 | Wu et al. |
| 2004/0089008 A1 | 5/2004 | Tilton et al. |
| 2004/0125561 A1 | 7/2004 | Gwin et al. |
| 2004/0160741 A1 | 8/2004 | Moss et al. |
| 2004/0188069 A1 | 9/2004 | Tomioka et al. |

OTHER PUBLICATIONS

J. H. Wang et al., "Thermal–Hydraulic Characteristic of Micro Heat Exchangers", 1991, DSC–vol. 32, Micromechanical Sensors, Actuators and Systems, pp. 331–339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16–23.

X. F. Peng et al., "Heat Transfer Characteristics of Water Flowing through Microchannels", Experimental Heat Transfer An International Journal, vol. 7, No. 4, Oct.–Dec. 1994, pp. 265–283.

Linan Jiang et al., "Forced Convection Boiling in a Microchannel Heat Sink", Journal of Microelectromechanical Systems, vol. 10, No. 1, Mar. 2001, pp. 80–87.

Muhammad M. Rahman et al., "Experimental Measurements of Fluid Flow and Heat Transfer in Microchannel Cooling Passages in a Chip Substrate", 1993, EEP–vol. 4–2, Advances in Electronic Packages, pp. 685–692.

X. F. Peng et al., "Forced convection and flow boiling heat transfer for liquid flowing through Microchannels", 1993, Int. J. Heat Mass Transfer, vol. 36, No. 14, pp. 3421–3427.

Lung–Jieh Yang et al., "A Micro Fluidic System of Micro Channels with On–Site Sensors by Silicon Bulk Micromaching", Sep. 1999, Microfluidic Devices and Systems, II, vol. 3877, pp. 267–272.

G. Mohjuddin Mala et al., "Heat transfer and fluid flow in microchannels", 1997, Int. J. Mass transfer, vol. 40, No. 13, pp. 3079–3088, printed in Great Britain.

J. M. Cuta et al., "Fabrication and Testing of Micro–Channel Heat Exhangers", SPIE Microlithography and Metrology in Micromaching, vol. 2640, 1995, pp. 152–160.

Linan Jiang et al., "A Micro–Channel Heat Sink with Integrated Temperature Sensors for Phase Transition Study", 1999, 12$^{th}$ IEEE International Conference on Micro Electro Mechanical Systems, pp. 159–164.

Linan Jiang et al., "Fabrication and characterization of a microsystem for a micro–scale heat transfer study", J. Micromech. Microeng. 9 (1999) pp. 422–428, printed in the U.K.

M. B. Bowers et al., "High flux boiling in low flow rate, low pressure drop mini–channel and micro–channel heat sinks", 1994, Int. J. Heat Mass Transfer, vol. 37, No. 2, pp. 321–332.

Yongendra Joshi, "Heat out of small packages", Dec. 2001, Mechanical Engineer, pp. 56–58.

A. Rostami et al., "Liquid Flow and Heat Transfer in Microchannels: a Review", 2000, Heat and Technology, vol. 18, No. 2, pp. 59–68.

Lian Zhang et al., "Measurements and Modeling of Two–Phase Flow in Microchannels with Nearly Constant Heat Flux Boundary Conditions", Journal of Microelectromechanical Systems, vol. 11, No. 1, Feb. 2002, pp. 12–19.

Muhammad Mustafizur Rahman, "Measurements of Heat Transfer in Microchannel Heat Sinks", Int. Comm. Heat Mass Transfer, vol. 27, No. 4, May 2000, pp. 495–506.

Issam Mudawar et al., "Enhancement of Critical Heat Flux from High Power Microelectronic Heat Sources in a Flow Channel", Journal of Electronic Packaging, Sep. 1990, vol. 112, pp. 241–248.

Nelson Kuan, "Experimental Evaluation of Micro Heat Exchangers Fabricated in Silicon", 1996, HTD–vol. 331, National Heat Transfer Conference, vol. 9, pp. 131–136.

E. W. Kreutz et al., "Simulation of micro–channel heat sinks for optoelectronic microsystems", Microelectronics Journal 31(2000) pp. 787–790.

J.C.Y. Koh et al., "Heat Transfer of Microstructure for Integrated Circuits", 1986, Int. Comm. Heat Mass Transfer, vol. 13, pp. 89–98.

Snezana Konecni et al., "Convection Cooling of Microelectronic Chips", 1992, InterSociety Conference on Thermal Phenomena, pp. 138–144.

Michael B. Kleiner et al., "High Performance Forced Air Cooling Scheme Employing Microchannel Heat Exchangers", 1995, IEEE Transactions on Components, Packaging, and Manufacturing Technology–Part A, vol. 18, No. 4, pp. 795–804.

Jerry K. Keska Ph. D. et al., "An Experimental Study on an Enhanced Microchannel Heat Sink for Microelectronics Applications", EEP–vol. 26–2, Advances in Electronic Packaging, 1999, vol. 2, pp. 1235–1259.

Shung–Wen Kang et al., "The Performance Test and Analysis of Silicon–Based Microchannel Heat Sink", Jul. 1999, Terahertz and Gigahertz Photonics, vol. 3795, pp. 259–270.

Joseph C. Tramontana, "Semiconductor Laser Body Heat Sink", Xerox Disclosure Journal, vol. 10, No. 6, Nov./Dec. 1985, pp. 379–381.

Sarah Arulanandam et al., "Liquid transport in rectangular microchannels by electroosmotic pumping", Colloid and Surfaces A: Physicochemical and Engineering Aspects 161 (2000), pp. 89–102.

Jeffrey D. Barner et al., "Thermal Ink Jet Print Head Carriage with Integral Liquid Cooling Capabilities", Xerox Disclosure Journal–vol. 21, No. 1, Jan./Feb. 1996, pp. 33–34.

"Autonomous displacement of a solution in a microchannel by another solution", Research Disclosure, Jun. 2001, pp. 1046–1047.

John M. Waldvogel, "Aluminum Silicon Carbide Phase Change Heat Spreader", Motorola, Jun. 1999, Technical Developments, pp. 226–230.

James P. Slupe et al., "An idea for maintaining a stable thermal environment for electronic devices", Research Disclosure, Aug. 2001, p. 1312.

John M. Waldvogel, "A Heat Transfer Enhancement Method for Forced Convection Bonded–Fin Heatsinks", Motorola, Dec. 1997, Technical Developments, pp. 158–159.

"Thin Heat Pipe for Cooling Components on Printed Circuit Boards", IBM Technical Disclosure Bulletin, vol. 34, No. 7B, Dec. 1991, pp. 321–322.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", Oct. 1971, IBM Technical Disclosure Bulletin, vol. 14, No. 5, p. 1425.

"Enhanced Cooling of Thermal Conduction Module", IBM Technical Disclosure Bulletin, vol. 30, No. 5, Oct. 1987, p. 426.

"Heat Exchanger Modules for Data Process with Valves Operated by Pressure form Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellow Providing Inlet, Outlet and Redundant Connections to Water–Cooled Element", IBM Technical Bulletin, vol. 30, No. 5, Oct. 1987, pp. 345–347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39–40.

"Chip Cooling Device", IBM Technical Disclosure Bulletin, vol. 30, No. 9, Feb. 1988, pp. 435–436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378–3380.

N. P. Bailey et al., "Cooling Device for Controlled Rectifier", IBM Technical Disclosure Bulletin, vol. 21, No. 11, Apr. 1979, pp. 4609–4610.

W. J. Kleinfelder et al., "Liquid–Filled Bellows Heat Sink", IBM Technical Disclosure Bulletin, vol. 21, No. 10, Mar. 1979, pp. 4125–4126.

R. P. Chrisfield et al., "Distributed Power/Thermal Control", IBM Technical Disclosure Bulletin, vol. 22, No. 3, Aug. 1979, pp. 1131–1132.

A. J. Arnold et al., "Heat Sink Design for Cooling Modules in a Forced Air Environment", IBM Technical Disclosure Bulletin, vol. 22, No. 6, Nov. 1979, pp. 2297–2298.

A. J. Arnold, "Structure for the Removal of Heat from an Integrated Circuit Module", IBM Technical Disclosure Bulletin, vol. 22, No. 6, Nov. 1979, pp. 2294–2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass–Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat–Pipe Vapor Cooling Etched Silicon Structure", IBM Technical Disclosure Bulletin, vol. 25, No. 8, Jan. 1983, pp. 4118–4119.

J. R. Skobern, "Thermoelectrically Cooled Module", IBM Technical Disclose Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Critical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 38, No. 01, Jan. 1995, pp. 55–56.

"Self–Contained Active Heat Dissipation Device", IBM Technical Disclosure Bulletin vol. 39, No. 04, Apr. 1996, pp. 115–116.

C. J. Keller et al., "Jet Cooling Cup for Cooling Semiconductor Devices", IBM Technical Disclosure Bulletin, vol. 20, No. 9, Feb. 1978, pp. 3575–3576.

B. J. Ronkese, "Centerless Ceramic Package with Directly Connected Heat Sink", IBM Technical Disclosure Bulletin, vol. 20, No. 9, Feb. 1978, p. 3577–3578.

K. S. Sachar, "Liquid Jet Cooling of Integrated Circuit Chips", vol. 20, No. 9, Feb. 1978, pp. 3727–3728.

A. H. Johnson, "Device Cooling", IBM Technical Disclosure Bulletin, vol. 20, No. 10, Mar. 1978, pp. 3919–3920.

A. L. Pacuzzo et al., "Integrated Circuit Module Package Cooling Structure", IBM Technical Disclosure Bulletin, vol. 20, No. 10, Mar. 1978, pp. 3898–3899.

R. D. Durand et al., "Flexible Thermal Conductor for Electronic Module", IBM Technical Disclosure Bulletin, vol. 20, No. 1A, Apr. 1978, p. 4343.

D. Balderes et al., "Liquid Cooling of a Multichip Module Package", IBM Technical Disclosure Bulletin, vol. 20, No. 11A, Apr. 1978, pp. 4336–4337.

J. A. Dorler et al., "Temperature Triggerable Fluid–Coupling System for cooling Semiconductor Dies", IBM Technical Disclosure Bulletin, vol. 20, No. 11A, Apr. 1978, pp. 4386–4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334–4335.

A. J. Arnold, "Electronic Packaging Structure", IBM Technical Disclosure Bulletin, vol. 20, No. 11B, Apr. 1978, pp. 4820–4822.

V. Y. Doo et al., "High Performance Package for Memory", IBM Technical Disclosure Bulletin, vol. 21, No. 2, Jul. 1978, pp. 585–586.

"Multi–Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141–142.

J. Landrock et al., "Cooling System for Semiconductor Chips", IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755–2756.

"Circuit Package with Circulating Boiling Liquid and Local Heat Exchanger to Limit Vapor in Coolant Outlet", IBM Technical Disclosure Bulletin, vol. 31, No. 12 May 1989, p. 34.

"Circuit Module Cooling with Mutliple Pistons Contacting a Heat Spreader/Electrical Buffer Plate in Contact with Chip", IBM Technical Disclosure Bulletin, vol. 31, No. 12, May 1989, p. 5–7.

"TCM–LIKE Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, pp. 305–306.

"Water–Cooled Circuit Module with Grooves Forming Water Passages Near Heat–Producing Devices", IBM Technical Disclosure Bulletin, vol. 31, No. 12, May 1989, pp. 49–50.

"Cold Plate for Thermal conduction Module with Only Peripheral Mounting bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run–In Testing of Multi–Chip Modules", IBM Technical Disclosure Bulletin, vol. 32, No. 5A, Oct. 1989, p. 129–130.

"Means of Removing More Heat From a TCM (Or Other Liquid–Cooled Logic Package) By Reducing the Coolant Temperature", IBM Technical Disclosure Bulletin, vol. 32 No. 5A, Oct. 1989, pp. 153–154.

E. G. Loeffel et al., "Liquid Cooled Module with Compliant Membrane", IBM Technical Disclosure Bulletin, vol. 20, No. 2, Jul. 1977, pp. 673–674.

V. Y. Doo et al., "Method of Effective Cooling of a High Power Silicon Chip", IBM Technical Disclosure Bulletin, vol. 20, No. 4, Sep. 1977, pp. 1436–1437.

V. Y. Doo et al., Semiconductor Chip Cooling Package, IBM Technical Disclosure Bulletin, vol. 20, No. 4, Sep. 1977, pp. 1440–1441.

"Heat Sink Fabrication Method", IBM Technical Disclosre Bulletin, vol. 27, No. 10A, Mar. 1985, pp. 5656–5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 09, Sep. 1994, p. 171.

Youngcheol Joo et al., "Fabrication of Monolithic Microchannels for IC Chip Cooling", 1995, IEEE Micro Electro Mechanical Systems, pp. 362–367.

Jaisree Moorthy et al., *Active control of electroosmotic flow in microchannels using light,* Jan. 26, 2001, Sensors and Actuators B 75, pp. 223–229.

Andreas Manz et al., *Electroosmotic pumping and electrophoretic separations for miniaturized chemical analysis systems,* Sep. 16, 1994, J.Micromech. Microeng. 4 (1994), pp. 257–265, printed in the U.K.

E. B. Cummings et al., *Irrotationality of uniform electroosmosis,* Sep. 1999, Part of the SPIE Conference on Microfluidic Devices and Systems II, SPIE vol. 3877, pp. 180–189.

Stephen C. Jacobson et al., *Fused Quartz Substrates for Microchip Electrophoresis,* Jul. 1, 1995, Analytical Chemistry, vol. 67, No. 13, pp. 2059–2063.

Haim H. Bau, *Optimization of conduits' shape in micro heat exchangers,* Dec. 10, 1997, International Journal of Heat and Mass Transfer 41 (1998), pp. 2717–2723.

V. K. Dwivedi et al., *Fabrication of very smooth walls and bottoms of silicon microchannels for heat dissipation of semiconductor devices,* Jan. 25, 2000, Microelectronics Journal 31 (2000), pp. 405–410.

M. B. Bowers et al., *Two–Phase Electronic Cooling Using Mini–Channel and Micro–Channel Heat Sinks: Part 2–Flow Rate and Pressure Drop Constraints,* Dec. 1994, Journal of Electronic Packaging 116, pp. 298–305.

Meint J. de Boer et al., *Micromachining of Buried Micro Channels in Silicon,* Mar. 2000, Journal of Microelectromechanical systems, vol. 9, No. 1, pp. 94–103.

S. B. Choi et al., *Fluid Flow and Heat Transfer in Microtubes,* 1991, DSC–vol. 32, Micromechanical sensors, Actuators, and Systems, ASME 1991, pp. 123–134.

S. F. Choquette M. Faghri et al., *Optimum Design of Microchannel Heat Sinks,* 1996, DSC–vol. 59, Microelectromechanical Systems, (MEMS), ASME 1996, pp. 115–126.

David Copeland et al., *Manifold Microchannel Heat Sinks: Theory and Experiment,* 1995, EEP–vol. 10–2, Advances in Electronic Packaging ASME 1995, pp. 829–835.

J. M. Cuta et al., *Forced Convection Heat Transfer in Parallel Channel Array Microchannel Heat Exchanger,* 1996, PID–vol. 2/HID–vol. 338, Advances in Energy efficiency, Heat/Mass Transfer Enhancement, ASME 1996, pp. 17–23.

K. Fushinobu et al., *Heat Generation and Transport in Sub–Micron Semiconductor Devices,* 1993, HTD–vol. 253, Heat Transfer on the Microscale, ASME 1993, pp. 21–28.

Charlotte Gillot et al., *Integrated Micro Heat Sink for Power Multichip Module,* Sep. 3, 1999, IEEE Transactions on Industry Applications, vol. 36. No. 1. Jan./Feb. 2000, pp. 217–221.

John Gooding, *Microchannel heat exchangers—a review,* SPIE vol. 1997 High Heat Flux Engineering II (1993), pp. 66–82.

Koichiro Kawano et al., *Micro Channel Heat Exhanger for Cooling Electrical Equipment,* HTD–vol. 361–3/PID–vol. 3, Proceeding of the ASME Heat Transfer Division—vol. 3, ASME 1998, pp. 173–188.

Chad Harris et al., *Design and Fabrication of a Cross Flow Micro Heat Exchanger,* Dec. 2000, Journal of Microelectromechanical Systems, vol. 9, No. 4, pp. 502–508.

George M. Harpole et al., *Micro–Channel Heat Exchanger Optimization,* 1991, Seventh IEEE SEMI–THERM Symposium, pp. 59–63.

Pei–Xue Jiang et al., *Thermal–hydraulic performance of small scale micro–channel and prous–media heat–exchangers,* 2001, International Journal of Heat and Mass Transfer 44 (2001), pp. 1039–1051.

X.N. Jiang et al., *Laminar Flow Through Microchannels Used for Microscale Cooling Systems,* 1997, IEEE/CPMT Electronic Packaging Technology Conference, pp. 119–122, Singapore.

David Bazeley Tuckerman, *Heat–Transfer Microstructures for Integrated Circuits,* Feb. 1984, pp. ii–xix, pp. 1–141.

M Esashi, *Silicon micromachining for integrated microsystems,* 1996, Vacuum/volume 47/numbers 6–8/pp. 469–474.

T.S. Raviguruajan et al., *Effect of Heat Flux on Two–Phase Flow characteristics of Refrigerant Flow in a Micro–Channel Heat Exchanger,* HTD–vol. 329, National Heat Transfer Conference, vol. 7, ASME 1996, pp. 167–178.

T.S. Raviguruajan et al., *Single–Phase Flow Thermal Performance Characteristics of a Parallel Micro–Channel Heat Exchanger,* 1996, HTD–vol. 329, National Heat Transfer Conference, vol. 7, ASME 1996, pp. 157–166.

T.S. Raviguruajan et al., *Liquid Flow Characteristics in a Diamond–Pattern Micro–Heat Exchanger,* DSC–vol. 59 Microelectromechanical Systems, (IMEMS), ASME 1996, pp. 159–166.

T.S. Raviguruajan, *Impact of Channel Geometry on Two–Phase Flow Heat Transfer Characteristics of Refrigerants in Microchannel Heat Exchangers,* May 1998, Journal of Heat Transfer, vol. 120, pp. 485–491.

J. Pfahler et al., *Liquid Transport in Micron and Submicron Channels,* Mar. 1990, Sensors and Actuators, A21–A23 (1990), pp. 431–434.

Kenneth Pettigrew et al., *Performance of a MEMS based Micro Capillary Pumped Loop for Chip–Level Temperature Control,* 2001, The $14^{th}$ IEEE International Conference on Micro Electro Mechanical Systems, pp. 427–430.

C. Perret et al., *Microchannel integrated heat sinks in silicon technology,* Oct. 12–15, 1998, The 1998 IEEE Industry Applications Conference, pp. 1051–1055.

X. F. Peng et al., *Convective heat transfer and flow friction for water flow in microchannel structures,* 1996, Int. J. Heat Mass Transfer, vol. 39, No. 12, pp. 2599–2608, printed in Great Britain.

X.F. Peng et al., *Experimental investigation of heat transfer in flat plates with rectangular microchannels,* 1994, Int. J. Heat Mass Transfer, vol. 38, No. 1, pp. 127–137, printed in Great Britain.

X.F. Peng et al., *Cooling Characteristics with Microchanneled Structures,* 1994, Enhanced Heat Transfer, vol. 1, No. 4, pp. 315–326, printed in the United States of America.

Yoichi Murakami et al., *Parametric Optimization of Multichananneled Heat Sinks for VLSI Chip Cooling,* Mar. 2002, IEEE Transaction on Components and Packaging Technologies, vol. 24, No. 1, pp. 2–9.

D. Mundinger et al., *High average power 2–D laser diode arrays or silicon microchannel coolers,* CLEO '89/Friday Morning/404.

L.J. Missaggia et al., *Microchannel Heat Sinks for Two–Dimensional High–Power–Density Diode Laser Arrays,* 1989, IEEE Journal of Quantum Electronics, vol. 25, No. 9, Sep. 1989, pp. 1989–1992.

M.J. Marongiu et al., *Enhancement of Multichip Modules (MCMs) Cooling by Incorporating MicroHeatPipes and Other High Thermal Conductivity Materials into Microchannel Heat Sinks,* 1998, Electronic Components and Technology Conference, pp. 45–50.

C.R. Friedrich et al., *Micro heat exchangers fabricated by diamond machining,* Jan. 1994, Precision Engineering, vol. 16, No. 1, pp. 56–59.

Mali Mahalingam, *Thermal Management in Semicondutor Device Packaging,* 1985, Proceedings of the IEEE, vol. 73, No. 9, Sep. 1985, pp. 1396–1404.

T.M. Adams et al., *An experimental investigation of single–phase forced convection in microchannels,* 1997, Int. J. Heat Mass Transfer, vol. 41, Nos. 6–7, pp. 851–857, Printed in Great Britain.

T.M. Adams et al., *Applicability of traditional turbulent single–phase forced convection correlations to non–circular micrhchannels,* 1999, Int. J. Heat and Transfer 42 (1999) pp. 4411–4415.

Bassam Badran et al., *Experimental Results for Low–Temperature Silicon Micromachined Micro Heat Pipe Arrays Using Water and Methanol as Working Fluids,* May 31, 1997, Experimental Heat Transfer, 10: pp. 253–272.

D. Jed Harrison et al., *Electroosmotic Pumping Within A Chemical Sensor System Integrated on Silicon,* Session C9 Chemical Sensors and Systems for Liquids, Jun. 26, 1991, pp. 792–795.

Kurt Seller et al., *Electroosmotic Pumping and Valveless Control of Fluid Flow within a Manifold of Capillaries on a Glass Chip*, 1994, Analytical Chemistry, vol. 66, No. 20, Oct. 15, 1994, pp. 3485–3491.

Philip H. Paul et al., *Electrokinetic Generation of High Pressures Using Porous Microstructures*, 1998, Micro–Total Analysis Systems, pp. 49–52.

Gh. Mohiuddin Mala et al., *Flow characteristics of water through a microchannel between two parallel plates with electrokinetic effects*, 1997, Int. J. Heat and Fluid Flow, vol. 18, No. 5, pp. 489–496.

W.E. Morf et al., *Partial electroosmotic pumping in complex capillary systems Part 1: Principles and general theoretical approach*, Oct. 16, 2000, Sensors and Actuators B 72 (2001), pp. 266–272.

M. Esashi, *Silicon micromachining and micromachines*, Sep. 1, 1993, Wear, vol. 168, No. 1–2, (1993), pp. 181–187.

Stephanus Buttgenbach et al., *Microflow devices for miniaturized chemical analysis systems*, Nov. 4–5, 1998, SPIE–Chemical Microsensors and Applications, vol. 3539, pp. 51–61.

Sarah Arunlanandam et al., *Liquid transport in rectangular microchannels by electroosmotic pumping*, 2000, Colloids and Surfaces A: Physicochemical and Engineering Aspects vol. 161 (2000), pp. 89–102.

Linan Jiang et al., *Closed–Loop Electroosmotic Microchannel Cooling System for VLSI Circuits*, Mechanical Engineering Dept. Stanford University, pp. 1–27.

Susan L. R. Barker et al., *Fabrication, Derivatization and Applications of Plastic Microfluidic Devices*, Proceedings of SPIE, vol. 4205. Nov. 5–8, 2000, pp. 112–118.

Timothy E. McKnight et al., *Electroosmotically Induced Hydraulic Pumping with Integrated Electrodes on Microfluidic Devices*, 2001, Anal. Chem., vol. 73, pp. 4045–4049.

Chris Bourne, *Cool Chips plc Receives Nanotech Manufacturing Patent*, Jul. 31, 2002, pp. 1–2.

Frank Wagner et al., *Electroosmotic Flow Control in Micro Channels Produced by Scanning Excimer Laser Ablation*, 2000, Proceedings of SPIE vol. 4088, Jun. 14–16, 2000, pp. 337–340.

H. A. Goodman, *Data Processor Cooling With Connection To Maintain Flow Through Standby Pump*, Dec. 1983, IBM Technical Dislosure Bulletin, vol. 26, No. 7A, p. 3325.

*Electroerosion Micropump*, May 1990, IBM Technical Disclosure Bulletin, vol. 32, No. 12, pp. 342–343.

Shulin Zeng et al., *Fabrication and Characterization of Electrokinetic Micro Pumps*, 2000 Inter Society Conferences on Thermal Phenomena, pp. 31–35.

A. Manz et al., *Integrated Electoosmotic Pumps and Flow Manifolds for Total Chemical Analysis System*, 1991, Inter. Conf. on Solid–State Sensors and Actuators, pp. 939–941.

O. T. Guenat et al., *Partial electroosmotic pumping in complex capillary systems Part: 2 Fabrications and application of a micro total analysis system suited for continuous volumetric nanotitrations*, Oct. 16, 2000, Sensors and Actuators B 72 (2001) pp. 273–282.

J. G. Sunderland, *Electrokinetic dewatering and thickening. I. Introduction and historical review of electrokinetic applications*, Sep. 1987, Journal of Applied Electrochemistry vol. 17, No. 5, pp. 889–898.

J. C. Rife et al., *Acousto– and electroosmotic microfluidic controllers*, 1998, Microfluidic Devices and Systems, vol. 3515, pp. 125–135.

Purnendu K Dasgupta et al., *Electroosmosis: A Reliable Fluid Propulsion System for Flow Injection Analysis*, 1994, Anal. Chem., vol. 66, No. 11, pp. 1792–1798.

Ray Beach et al., *Modular Microchannel Cooled Heatsinks for High Average Power Laser Diode Arrays*, Apr. 1992, IEEE Journal of Quantum Electronics, vol. 28, No. 4, pp. 966–976.

Roy W. Knight et al., *Optimal Thermal Design of Air cooled Forced Convection finned Heat Sinks—Experimental Verification*, Oct. 1992, IEEE Transactions on Components, Hybrids, and Manufacturing Technology, vol. 15, No. 5 pp. 754–760.

Y. Zhuang et al., *Experimental study on local heat transfer with liquid impingement flow in two–dimensional micro–channels*, 1997, Int. J. Heat Mass Transfer, vol. 40, No. 17, pp. 4055–4059.

D. Yu et al., *An Experimental and Theoretical Investigation of Fluid Flow and Heat Transfer in Microtube*, 1995, ASME/JSME Thermal Engineering Conference, vol. 1, pp. 523–530.

Xiaoqing Yin et al., *Micro Heat Exchangers Consisting of Pin Arrays*, 1997, Journal of Electronic Packaging Mar. 1997, vol. 119, pp. 51–57.

X. Yin et al., *Uniform Channel Micro Heat Exchangers*, 1997, Journal of Electronic Packaging Jun. 1997, vol. 119, No. 2, pp. 89–94.

Chun Yang et al., *Modeling forced liquid convection in rectangular microchannels with electrokinetic effect*, 1998, International Journal of Heat and Mass Transfer 41 (1998), pp. 4229–4249.

Arel Weisberg et al., *Analysis of microchannels for integrated cooling*, 1992, Int. J. Heat Mass Transfer, vol. 35, No. 10, pp. 2465–2473.

Roger S. Stanley et al., *Two–Phase Flow in Microchannels*, 1997, DSE–vol. 62/HTD–vol. 354, MEMS, pp. 143–152.

B. X. Wang et al., *Experimental investigation on liquid forced–convection heat transfer through microchannels*, 1994, Int. J. Heat Mass Transfer, vol. 37 Suppl. 1, pp. 73–82.

Kambiz Vafai et al., *Analysis of two–layered micro–channel heat sink concept in electronic cooling*, 1999, Int. J. Heat Mass Transfer, 42 (1999), pp. 2287–2297.

Gokturk Tunc et al., *Heat transfer in rectangular microchannels*, 2002, Int. J. Heat Mass Transfer, 45 (2002), pp. 765–773.

D. B. Tuckerman et al., *High–Performance Heat Sinking for VLSI*, 1981, IEEE Electron Device Letters, vol. EDL–2, No. 5, pp. 126–129.

Bengt Sunden et al., *An Overview of Fabrication Methods and Fluid Flow and Heat Transfer Characteristics of Micro Channels*, pp. 3–23.

David S. Shen et al., *Micro Heat Spreader Enhance Heat Transfer in MCMs*, 1995, IEEE Multi–Chip Module Conference, pp. 189–194.

S. Sasaki et al., *Optimal Structure for Microgrooved Cooling Fin for High–Power LSI Devices*, Electronic Letters, Dec. 4, 1986, vol. 22, No. 25.

Vijay K. Samalam, *Convective Heat Transfer in Microchannels*, Sep. 1989, Journal of Electronic Materials, vol. 18, No. 5, pp. 611–617.

Sanjay K. Roy et al., *A Very High Heat Flux Microchannel Heat Exchanger for Cooling of Semiconductor Laser Diode Arrays*, 1996, IEEE Transactions on components, packaging, and manufacturing technology–part B, vol. 19, No. 2, pp. 444–451.

Charlotte Gillot et al., *Integrated Single and Two–Phase Micro Heat Sinks Under IGBT Chips*, IEEE Transactions on Components and Packaging Technology, vol. 22 No. 3, Sep. 1999, pp. 384–389.

X.F. Peng et al., "Enhancing the Critical Heat Flux Using Microchanneled Surfaces", Enhanced Heat Transfer, 1998, vol. 5 pp. 165–176.

H. Krumm "Chip Cooling", IBM Technical Disclosure Bulletin, vol. 20, No. 7, Dec. 1997, p. 2728.

Jae–Mo Koo et al., "Modeling of Two–Phase Microchannel Heat Sinks for VLSI Chips", Mech. Eng. Depart. of Stanford University, pp. 422–426.

* cited by examiner

US 7,017,654 B2

APPARATUS AND METHOD OF FORMING CHANNELS IN A HEAT-EXCHANGING DEVICE

RELATED APPLICATION

This application claims priority under 35 U.S.C. § 119(e) of the co-pending U.S. provisional patent application Ser. No. 60/455,729, filed on Mar. 17, 2003, and titled "Microchannel Heat Exchanger Apparatus with Porous Configuration and Method of Manufacturing Thereof." The provisional patent application Ser. No. 60/455,729, filed on Mar. 17, 2003, and titled "Microchannel Heat Exchanger Apparatus with Porous Configuration and Method of Manufacturing Thereof" is hereby incorporated by reference.

FIELD OF THE INVENTION

This invention relates to the field of heat exchangers. More particularly, this invention relates to a method and apparatus for circulating a cooling material through optimally shaped channels and other geometric structures in a heat exchanger.

BACKGROUND OF THE INVENTION

Certain heat sinks use pumps to pump a cooling material through a portion of the heat sink overlying a heat-generating source. The cooling material absorbs the heat generated by the heat-generating source and carries it away from the heat-generating source, thereby cooling the heat-generating source. Pumps used to transmit the cooling material through the heat sink are operated at maximum flow rates.

Cooling materials transmitted along channels used in these heat sinks generally suffer from excessive and non-uniform pressure drops. The pumps used to circulate cooling materials, already overworked to pump the cooling material at high rates, require even more energy to account for these pressure drops.

Heat sinks made according to U.S. patent application Ser. No. 10/612,241, titled "Multi-Level Microchannel Heat Exchangers," filed Jul. 1, 2003, require numerous semiconductor processing and assembly steps. While providing enhanced cooling capacity, these processing steps likely increase the cost of the heat exchanger. The benefits afforded by these processing and assembly steps may not be warranted by the added costs of manufacturing.

Accordingly, what is needed is a structure and a method of efficiently manufacturing a heat exchanger that provides for uniform pressure flows for the transmission of a cooling material.

BRIEF SUMMARY OF THE INVENTION

A heat exchanger circulates a cooling material that absorbs heat from a heat-generating source and carries the heat away from the heat-generating source, thereby cooling the heat-generating source. The heat exchanger can thus be used to cool a variety of heat sources, such as semiconductor devices, batteries, motors, walls of process chambers, and any source that generates heat.

In a first aspect of the present invention, a method of forming a heat exchanger comprises forming a manifold layer defining a plurality of apertures and forming an interface layer comprising one or more narrowing trenches. Each aperture is positioned on one side of a narrowing trench, whereby a path is defined from a first aperture, through a narrowing trench, and to a second aperture. In a first embodiment, the interface layer comprises a material exhibiting properties of anisotropic etching. Preferably, the material comprises a <110> oriented silicon substrate. In another embodiment, forming an interface layer comprises etching the <110> oriented silicon substrate in an etchant to produce a <111> oriented surface defining a sloping wall of a narrowing trench. Alternatively, the material is any orientation of silicon and is etched in an anisotropic plasma etch to form one or more narrowing trenches. In further embodiments, the etchant comprises potassium hydroxide (KOH) or tetramethyl ammonium hydroxide (TMAH). In another embodiment the one or more narrowing trenches are formed by a machining process such as milling, sawing, drilling, stamping, electrical discharge machining (EDM), wire EDM, coining, die casting, investment casting, or any combination of these. Alternatively, the one or more narrowing trenches are formed by electroplating, metal injection molding, LIGA processes, casting, or any combination of these.

In another embodiment, the manifold layer and the interface layer are formed of a monolithic device. In another embodiment, the method further comprises coupling the manifold layer to the interface layer. Coupling the manifold layer to the interface layer can comprise adhesively bonding the manifold layer to the interface layer, thermally fusing the manifold layer to the interface layer, anodically bonding the manifold layer to the interface layer, and eutectically bonding the manifold layer to the interface layer. In another embodiment, the manifold layer comprises a material selected from the group consisting essentially of a plastic, a glass, a metal, and a semiconductor.

In another embodiment, forming the manifold layer comprises forming a first plurality of interconnected hollow fingers and a second plurality of interconnected hollow fingers. The first plurality of interconnected hollow fingers provides flow paths to the one or more first apertures and the second plurality of interconnected hollow fingers provides flow paths from the one or more second apertures. Preferably, the first plurality of interconnected hollow fingers and the second plurality of interconnected hollow fingers lie substantially in a single plane.

In another embodiment, the method further comprises coupling a pump to the first plurality of interconnected hollow fingers. In another embodiment, the method further comprises coupling a heat-generating source to the interface layer. In another embodiment, the method comprises integrally forming a bottom surface of the interface layer with the heat-generating source. In another embodiment, the heat-generating source comprises a semiconductor microprocessor. In another embodiment, the method further comprises introducing a cooling material to the pump, so that the pump circulates the cooling material along the first plurality of fingers, to the one or more first apertures, along a the plurality of narrowing trenches, to the one or more second apertures, and to the second plurality of fingers, thereby cooling the heat-generating source. In another embodiment, the cooling material comprises a liquid, such as water. In other embodiments, the cooling material comprises a liquid/vapor mixture. In another embodiment, each aperture lies substantially in a single plane, parallel to a lower surface of the interface layer. In another embodiment, the manifold layer comprises a surface that extends into each narrowing trench and substantially conforms to a contour of each narrowing trench. In another embodiment, a narrowing trench has a depth:width aspect ratio of at least approximately 10:1.

In another embodiment, the method further comprises coupling an intermediate layer between the manifold layer and the interface layer. The intermediate layer comprises a plurality of openings positioned over the plurality of apertures, thereby controlling the flow of a cooling material to the paths.

In a second aspect of the present invention, a heat exchanger comprises a manifold layer defining a plurality of apertures, and an interface layer comprising a plurality of narrowing trenches. Each aperture is positioned on one side of a narrowing trench, whereby a path is defined from a first aperture, through a narrowing trench, and to a second aperture. In another embodiment, the interface layer comprises a material exhibiting anisotropic etching. Preferably, the material comprises a <110> oriented silicon substrate. In another embodiment, the interface layer is formed by etching the <110> oriented silicon substrate in an etchant to produce a <111> oriented surface defining a sloping wall of a narrowing trench. In other embodiments, the etchant comprises potassium hydroxide (KOH) or tetramethyl ammonium hydroxide (TMAH). In one embodiment, the narrowing trenches are formed by a machining process, such as milling, sawing, drilling, stamping, EDM, wire EDM, coining, die casting, investment casting, or any combination of these. Alternatively, the narrowing trenches are formed by electroplating, metal injection molding, LIGA processes, casting, or any combination of these.

In another embodiment, the manifold layer and the interface layer are formed of a monolithic device. In another embodiment, the manifold layer is coupled to the interface layer. The manifold layer can be coupled to the interface layer by adhesive bonding, thermal fusing, anodic bonding, or eutectic bonding. In another embodiment, the manifold layer comprises a material selected from the group consisting essentially of a plastic, a glass, a metal, and a semiconductor.

In another embodiment, the manifold layer comprises a first plurality of interconnected hollow fingers and a second plurality of interconnected hollow fingers. The first plurality of interconnected hollow fingers provide flow paths to the one or more first apertures and the second plurality of interconnected hollow fingers providing flow paths from the one or more second apertures. Preferably, the first plurality of interconnected hollow fingers and the second plurality of interconnected hollow fingers lie substantially in a single plane.

In another embodiment, the manifold layer comprises a first layer comprising one or more of the first apertures and one or more of the second apertures, and a second layer comprising a first plurality of interconnected fingers and a second plurality of interconnected fingers. The first plurality of interconnected fingers provides flow paths to the one or more first apertures and the second plurality of fingers provides flow paths from the one or more second apertures.

In another embodiment, the heat exchanger further comprises a pump coupled to the first plurality of fingers. In another embodiment, the heat exchanger further comprises a heat-generating source coupled to the interface layer. In another embodiment, the heat-generating source comprises a semiconductor microprocessor. In another embodiment, the heat-generating source is integrally formed to a bottom surface of the interface layer. In another embodiment, each aperture lies substantially in a single plane, parallel to a lower surface of the interface layer. In another embodiment, the manifold layer comprises a surface that extends into each trench and substantially conforms to a contour of each narrowing trench. In another embodiment, a depth:width aspect ratio for at least one of the plurality of narrowing trenches is at least 10:1.

In another embodiment, the heat exchanger further comprises an intermediate layer positioned between the manifold layer and the interface layer. The intermediate layer comprises a plurality of openings positioned over the plurality of apertures, thereby controlling the flow of a cooling material to the paths.

DETAILED DESCRIPTION OF THE INVENTION

Figure 1A:
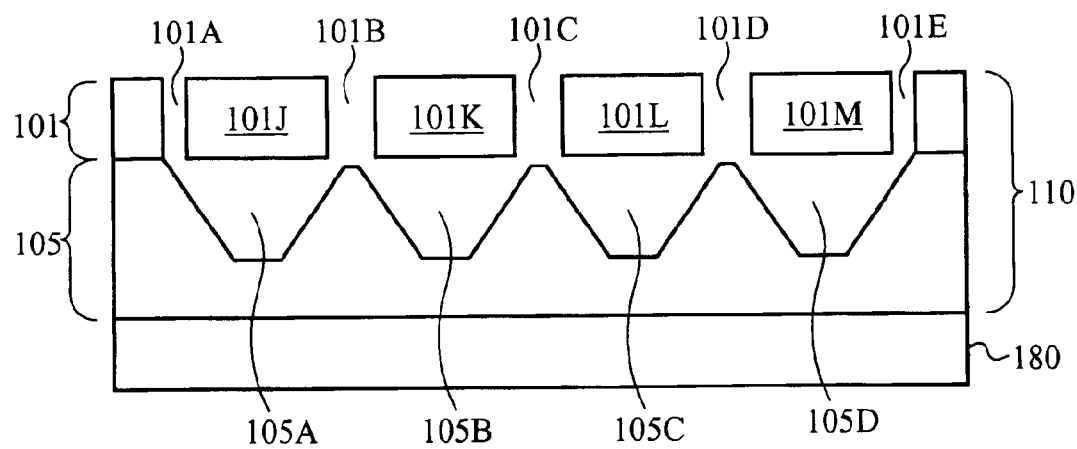
FIG. 1A is a side cross-sectional view of an interface layer and a portion of a manifold layer, together forming a heat exchanger in accordance with the present invention, coupled to a heat-generating source.

FIG. 1A is a side cross-sectional view of a portion of a heat exchanger 110 coupled to a heat-generating source 180.

The heat exchanger 110 comprises a manifold layer 101 and an interface layer 105. The manifold layer 101 comprises a surface having a plurality of apertures 101A–E and a plurality of solid portions 101J–M. The interface layer 105 comprises a plurality of narrowing trenches 105A–D and is coupled at a bottom surface to the heat-generating source 180. Each narrowing trench is defined by a sloping sidewall, a substantially planar floor, and a second sloping sidewall. Each trench is narrowing in that a cross-sectional area at an upper plane of a trench is larger than a cross-sectional area at a bottom plane of the trench, realized, for example, by sloping sidewalls. As described in more detail below, the plurality of apertures 101A–E, the plurality of solid portions 101J–M, and the narrowing trenches 105A–D define flow paths or channels that can accommodate the flow of a cooling material. The cooling material comprises a fluid, such as a liquid, a vapor, air, or any combination of these. Circulating the cooling material in a narrowing trench above the heat-generating source 180 will cool that heat-generating source 180 at an area below the narrowing trench.

Figure 1B:
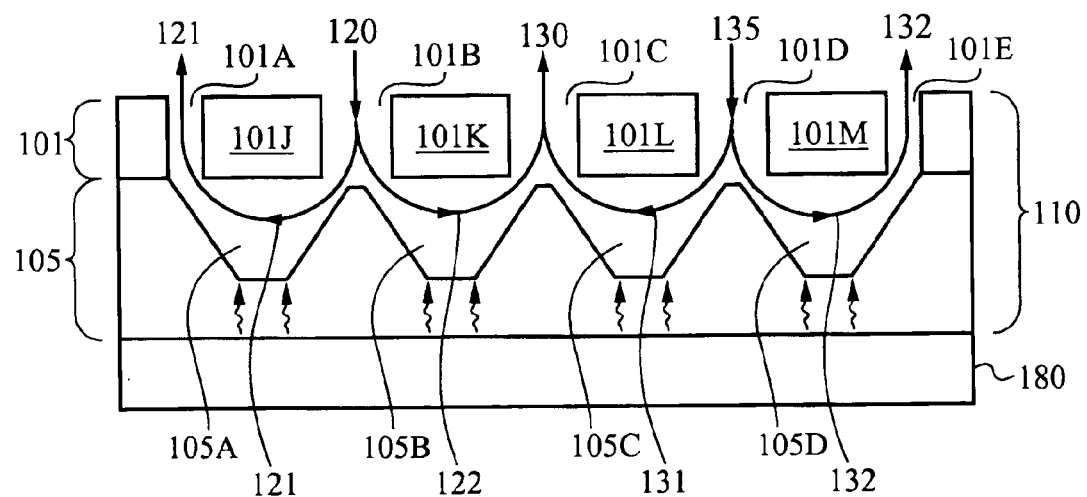
FIG. 1B is a side cross-sectional view of the heat exchanger and heat-generating source of FIG. 1A, showing flow paths traveled by a cooling material.

FIG. 1B is the side cross-sectional view of the heat exchanger 110 and heat-generating source 180 depicted in FIG. 1A. FIG. 1B further illustrates a cooling material introduced into the apertures 101B and 101D and removed from the apertures 10A, 101C, and 101E. Arrows in FIG. 1B indicate the direction of flow for the cooling material. The squiggly arrows show the path of heat from the heat-generating source 180 to the cooling material. Thus, as illustrated in FIG. 1B, in operation a cooling material is introduced into the apertures 101B and 101D by, for example, a pump (not shown) coupled to the apertures 101B and 101D. The cooling material introduced into the aperture 101B on the flow path 120 is divided into the flow paths 121 and 122. That portion of the cooling material traveling along the flow path 121 is channeled from the aperture 101B, to the narrowing trench 105A, and to the aperture 101A. The cooling material traveling along the flow path 121 absorbs the heat conducted by the interface layer 105 from the heat-generating source 180 to the cooling material substantially adjacent to the narrowing trench 105A. The cooling material traveling along the flow path 121 is then channeled to the aperture 101A, carrying the absorbed heat away from the heat-generating source 180, and thus cooling the heat-generating source 180 at a position substantially adjacent to the narrowing trench 105A. That portion of the cooling material traveling along the flow path 122 is channeled from the aperture 101B, to the narrowing trench 105B, and to the aperture 101C, thus cooling the heat-generating source 180 at a location substantially adjacent to the narrowing trench 105B. As illustrated in FIG. 1B, the cooling material traveling along the flow path 122 combines with the cooling material traveling along a flow path 131 to form cooling material traveling out of the aperture 101C along a flow path 130.

Similarly, cooling material introduced into the aperture 101D along a flow path 135 is divided into flow paths 131 and 132. That portion of the cooling material traveling along the flow path 131 is channeled from the aperture 101D, to the narrowing trench 105C, and to the aperture 101C, thus cooling the heat-generating source 180 at a location substantially adjacent to the narrowing trench 105C. As discussed above, the cooling material from the flow path 131 is combined with the cooling material from the flow path 122 to form cooling material on a flow path 130 at the aperture 101C. That portion of the cooling material traveling along the flow path 132 is channeled from the aperture 101D, to the narrowing trench 105D, and to the aperture 101E, thus cooling the heat-generating source 180 at a location substantially adjacent to the narrowing trench 105D.

The cooling material removed from the apertures 101A, 101C, and 101E can be processed in many ways. For example, the cooling material can removed from the heat exchanger 110, or it can be re-cooled and reintroduced into the apertures 101B and 101D.

As described in more detail below, the manifold layer 101 can have many shapes useful for providing a cooling material to the apertures 101B and 101D and for removing the cooling material from the apertures 10A, 101C, and 101E. It will be appreciated that the roles of the apertures can be reversed or assigned in different combinations. For example, the apertures 10A, 101C, and 101E can be used to introduce a cooling material into the channels formed by the narrowing trenches and the apertures 101B and 101D used to remove the cooling material from the channels formed by the narrowing trenches. Also, while the drawings show only five apertures 10A–E and four narrowing trenches 105A–D, fewer or more apertures and narrowing trenches can be formed in accordance with the present invention.

Preferably, the interface layer 105 has a thermal conductivity sufficient to conduct heat generated at the heat-generating source 180 to the cooling material traveling along the fluid paths 121, 122, 131, and 132. Preferably, the interface layer 105 has a thermal conductivity of approximately 20 W/m-K or larger. Preferably, the interface layer comprises a silicon material. It will be appreciated, however, that the interface layer 105 can comprise other materials, such as a metal, and can have a thermal conductivity smaller than 20 W/m-K.

It is believed that fluid paths channeled along sloping sidewalls, rounded corners, and other non-perpendicular edges in accordance with the present invention have advantages over channels having substantially perpendicular edges. Because sloping sidewalls provide a more uniform flow path than do right-angled sidewalls, there are fewer pressure drops along the flow path. Thus, a pump requires less energy to transmit the cooling material along the channels and thus forms part of a more efficient heat-exchanging system.

Figure 2:
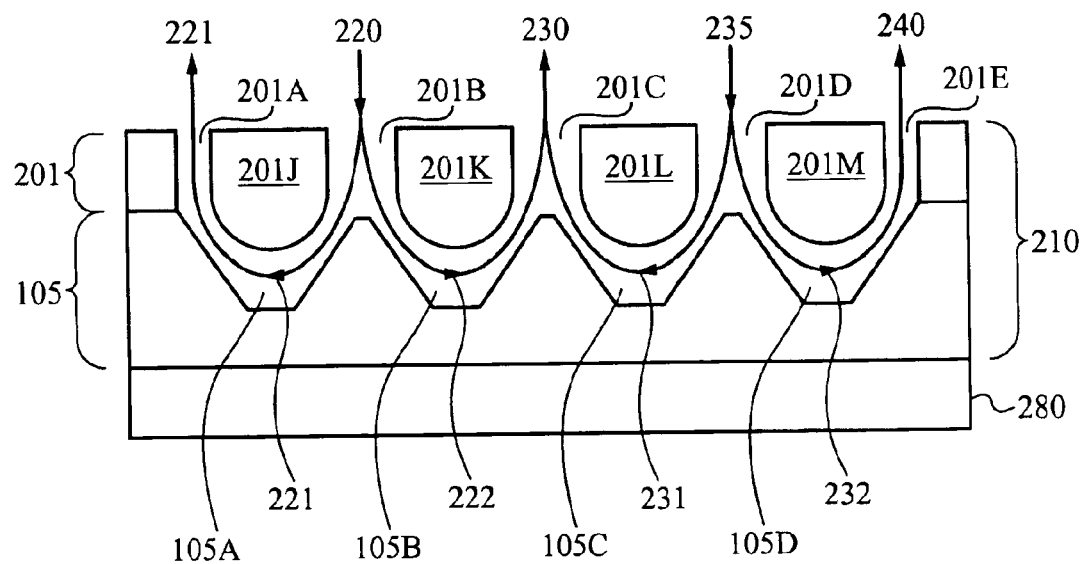
FIG. 2 is a side cross-sectional view of an interface layer and a portion of a manifold layer, together forming a heat exchanger in accordance with the present invention, coupled to a heat-generating source, with the manifold layer having a curving bottom surface that extends into a plurality of the trenches that forms the interface layer.

FIG. 2 is a side cross-sectional view of a heat exchanger 210, in accordance with the present invention, coupled to a heat-generating source 280. The heat-exchanger 210 comprises the interface layer 105 of FIG. 1A and a manifold layer 201 comprising a plurality of apertures 201A–E and a plurality of solid portions 201J–M. FIG. 2 also depicts a flow path 220 from the aperture 201B, divided into a flow path 221 to the aperture 201A and a flow path 222 to the aperture 201C. A flow path 235 from the aperture 201D is divided into the flow paths 231 and 232. The flow path 231 is combined with the flow path 222 to form a flow path 230 at the aperture 201C. The flow path 232 extends to the aperture 201E. As illustrated in FIG. 2, a bottom surface of the solid portion 201J that forms part of the flow path 221 extends into the narrowing trench 205A and substantially conforms to the contour of the narrowing trench 205A. The bottom surface of the solid portion 201J thus has a non-perpendicular and preferably rounded surface that forms part of the flow path 221. This configuration is expected to enhance the fluid flow of the cooling material at the bottom of each narrowing trench 105A, 105B, 105C, and 105D, thereby enhancing the heat removal while reducing the pressure drops. A bottom surface of the solid portions 201K–M, forming part of the flow paths 222, 231, and 232, respectively, have similar contours.

Figure 3:
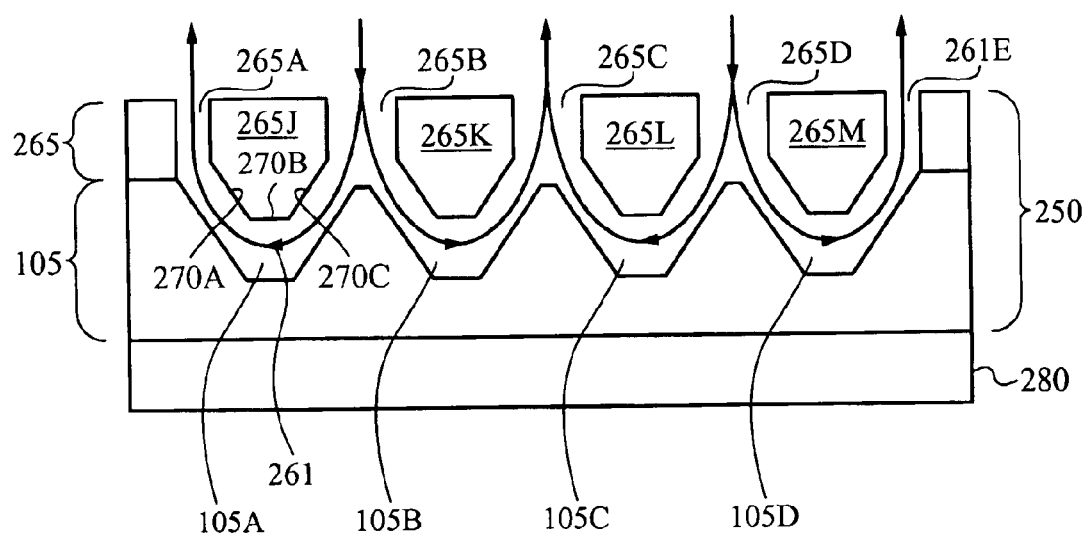
FIG. 3 is a side cross-sectional view of an interface layer and a portion of a manifold layer, together forming a heat exchanger in accordance with the present invention, coupled to a heat-generating source, with the manifold layer having a piecewise curving bottom surface that extends into a plurality of the trenches that form the interface layer.

It will be appreciated that the bottom surfaces of the solid portions 201J–M, which form part of the flow paths for the heat exchanger 210 and substantially conform to the contour of the narrowing trenches 105A–D, can have other shapes, such as a polygonal shape that approximately mirrors the shape of the narrowing trenches 105A–D. For example, FIG. 3 illustrates a cross-sectional diagram of a heat exchanger 250, in accordance with the present invention, coupled to the heat-generating source 280. The heat exchanger 250 comprises the interface layer 105 described above and a manifold layer 265 having apertures 265A–E and solid portions 265J–M. FIG. 3 also shows an exemplary flow path 261 from the aperture 265B to the aperture 265A. The solid portions 265J–M each has a bottom surface that extends into each of the plurality of narrowing trenches 105A–D, respectively. The solid portion 265J is exemplary. As illustrated in FIG. 3, the bottom surface of the solid portion 265J is formed from piecewise straight edges, such as exemplary piecewise straight edges 270A–C, which extend into the narrowing trench 105A. As described above, it will be appreciated that because the bottom surface of the solid portion 265J extends into the narrowing trench 105D, the flow path 261 has a smaller cross-sectional area than a corresponding flow path formed when the bottom surface of a solid portion does not extend into the narrowing channels. Thus, for example, the flow path 261 illustrated in FIG. 3 has a smaller cross-sectional area than the flow path 121 illustrated in FIG. 1B.

This structure has several advantages. For example, a cooling material traveling along the exemplary fluid flow paths 221 (FIG. 2) and 261 (FIG. 3) do not encounter any sharp edges as they travel between apertures, cooling a heat-generating source, and thus travel with fewer pressure drops. These structures also reduce the volume of the channel (flow path) along which the cooling material is transmitted. Forcing the same amount of cooling material along each smaller channel increases the velocity of the cooling material, which will increase the rate at which heat is carried away from the heat-generating source 280. Those skilled in the art will recognize other advantages with a manifold layer having a bottom surface that defines a portion of a channel, conforming to the shape of a narrowing trench.

It will be appreciated that while the above drawings depict symmetrical features, such as trenches and solid portions, heat exchangers in accordance with the present invention can have non-symmetrical features. Specifically, it may be advantageous to have larger openings at the outlets than at the inlets to accommodate the volume expansion associated with the transition from liquid to liquid/vapor mixtures. The narrowing trenches 105A–D (FIG. 1A) can also have different shapes and dimensions. And rather than aligned in symmetrical rows, the narrowing trenches can be apportioned in any number between rows, can even be staggered, or can be positioned and distributed in any manner to fit the application at hand. Furthermore, it will be appreciated that while FIGS. 1A–B, 2, and 3 all depict a one-dimensional view of a heat exchanger with four narrowing trenches 105A–D, it will be appreciated that a heat exchanger in accordance with the present invention can have fewer than or more than four trenches in a one-, two- or three-dimensional configuration.

Figure 4:
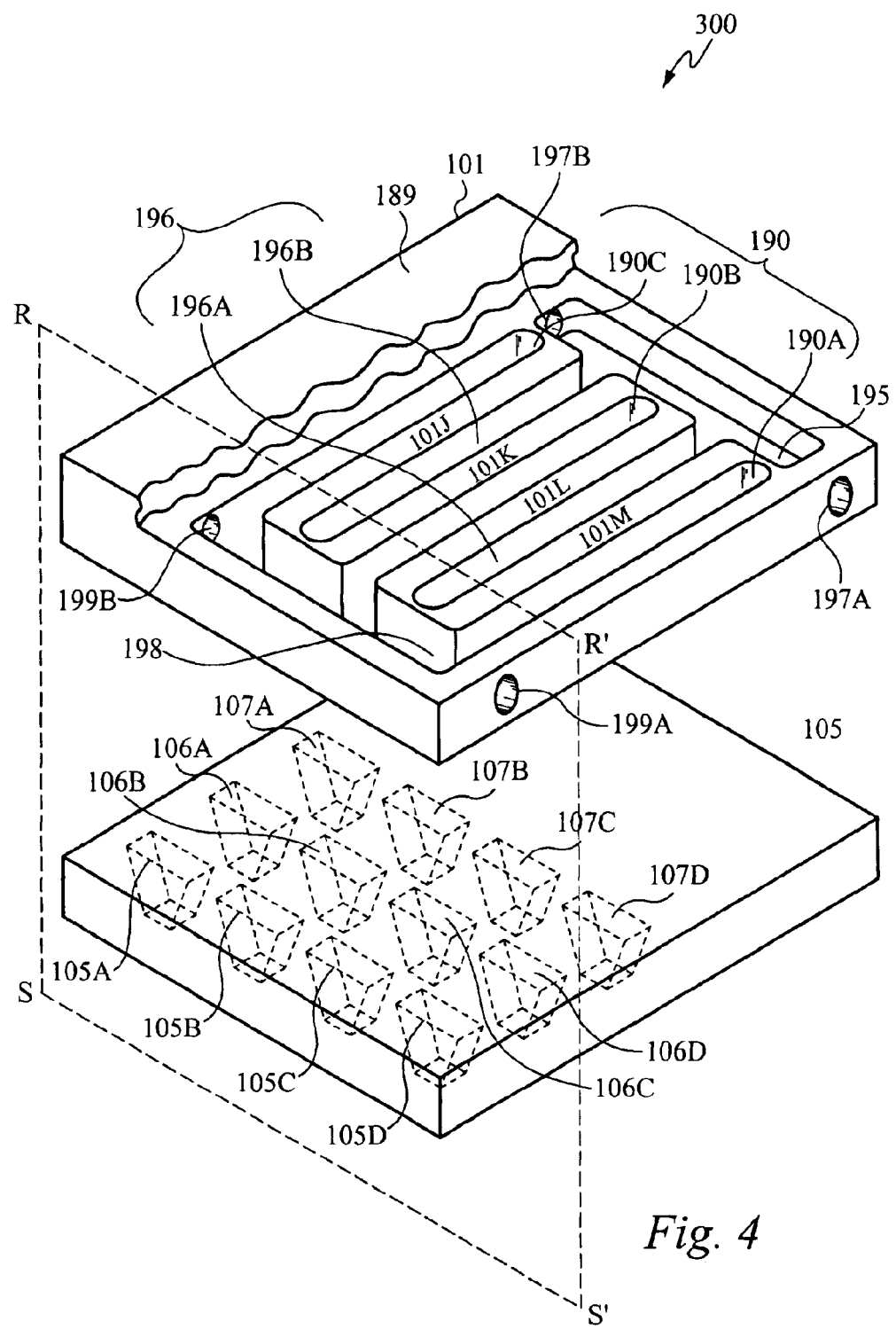
FIG. 4 is a perspective view of the manifold layer and the interface layer of FIG. 1A.

FIG. 4, for example, is a perspective view of a heat exchanger 300 with a plurality of narrowing trenches in a two-dimensional configuration, used to cool a heat-generating source (not shown). It is believed that using a large number of small narrowing trenches has advantages over using a small number of large narrowing trenches to cool a heat-generating source. It is believed that small narrowing trenches formed without any sharp angles advantageously reduce pressure drops associated with cooling materials transmitted through the heat exchanger, thus requiring less energy to pump the cooling material through the heat exchanger. It is also believed that the smaller narrowing trenches increase the surface-to-volume ratio of the cooling material to the surface of the heat-generating source, thus aiding in more efficiently cooling the heat-generating source.

The heat exchanger 300 comprises the manifold layer 101 and the interface layer 105, both of FIG. 1A, but gives a more complete three-dimensional view of each. FIG. 1A illustrates only a cross-sectional portion of the manifold layer 101. FIG. 4 illustrates the manifold layer 101 with a portion of a top, enclosing surface 189 cut away to expose elements of the manifold layer 101, contained below the top surface 189 and described below. As described in more detail above, the interface layer 105 comprises the narrowing trenches 105A–D and narrowing trenches 106A–D and 107A–D. Because the narrowing trenches 106A–D and 107A–D perform similar functions to the narrowing trenches 105A–D, the following discussions will be limited to the narrowing trenches 105A–D. FIG. 4 also shows a plane RR'SS' perpendicular to the top surface 189 and described below in relation to FIG. 7.

Still referring to FIG. 4, the manifold layer 101 comprises a first plurality of hollow fingers 196A–B (collectively, 196), a second plurality of hollow fingers 190A–C (collectively, 190), solid portions 11J–M, a first reservoir 195, a second reservoir 198, inlet ports 197A and 197B coupled to the first reservoir 195, and outlet ports 199A and 199B coupled to the second reservoir 198. Preferably, the hollow fingers 190 and 196 all lie substantially in a single plane, parallel to a bottom surface of the manifold layer 101. As described below, the hollow fingers 190 and 196 are openings in the manifold layer 101, providing communications path between a top surface of the manifold layer 101 and a bottom surface of the manifold layer 101. The hollow fingers 196 are coupled to the first reservoir 195 and thus to each other, and provide a flow (communication) path from the first reservoir 195 to a first portion of the bottom surface of the manifold layer 101. Thus, in operation, a cooling material can flow from the inlet ports 197A–B, to the first reservoir 195, to the hollow fingers 196, and through the bottom of the manifold layer 101 into the interface layer 105. Similarly, the hollow fingers 190 are coupled to the second reservoir 198 and thus to each other, and provide a flow path from the interface layer 105 up through the bottom of the manifold layer 101, and to the second reservoir 198. Thus, in operation, a cooling material can flow from the inlet ports 197A–B, through the hollow fingers 196, down to the interface layer 105, along a narrowing trench 105D, back up to the hollow fingers 190 in the manifold layer 101, and to the outlet ports 199A–B.

Figure 5:
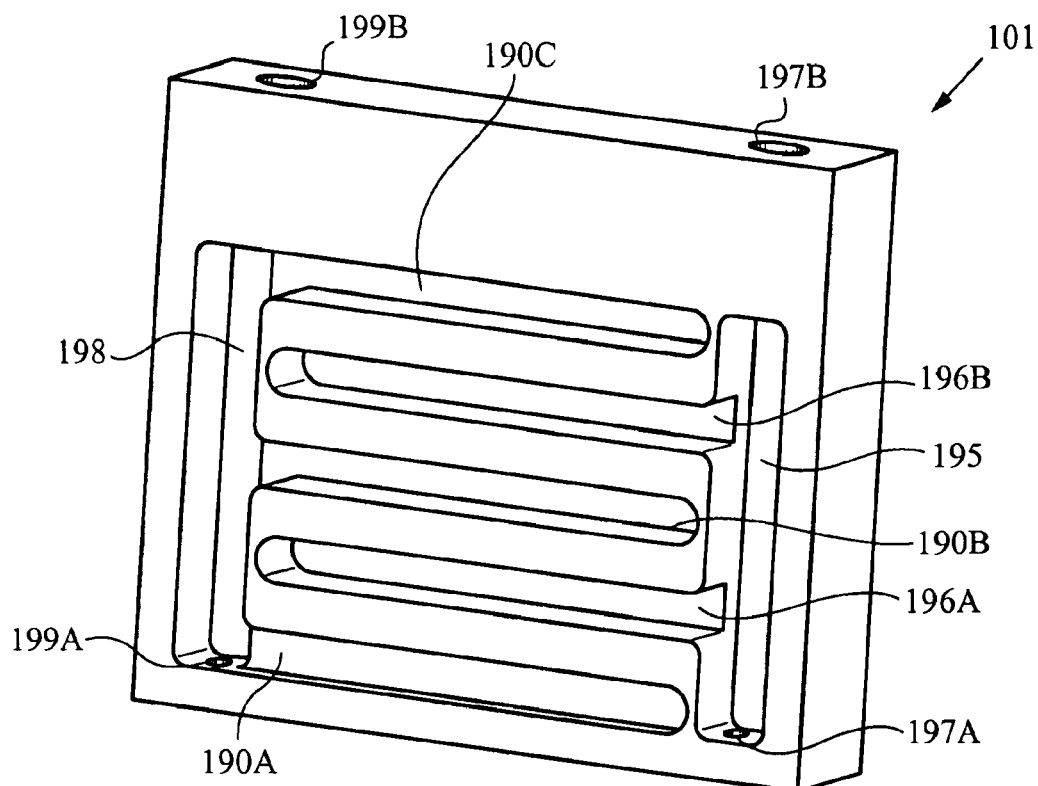
FIG. 5 is a perspective view of the manifold layer of FIG. 4.

As illustrated in FIG. 4, the hollow fingers 196 are interwoven with the hollow fingers 190 in that the hollow fingers 196 are interdigitated with the hollow fingers 190. Moreover, the solid portions 101J–M alternate with the hollow fingers 196 and the hollow fingers 190. Thus, the solid portion 101M is between the hollow fingers 190A and 196A, the solid portion 101L is between the hollow fingers 196A and 190B, the solid portion 101K is between the hollow fingers 190B and 196B, and the solid portion 101J is between the hollow fingers 196B and 190C. The solid portions 101J–M thus provide structure for the manifold layer 101. FIG. 5 is a perspective view of the manifold layer 101 of FIG. 4, with the top surface 189 (FIG. 4) completely removed.

It will be appreciated that manifold layers used in accordance with the present invention can have configurations different from those described here. For example, the hollow fingers 190A–C need not be coupled to each other by the reservoir 198, and the hollow fingers 196A–B need not be coupled to each other by the reservoir 195. The plurality of hollow fingers 190 need not be interwoven with the plurality of hollow fingers 196. Manifold layers with any number and combination of hollow fingers can be used. Examples of manifold layers that can be used in accordance with the present invention are taught in co-pending U.S. patent application Ser. No. 10/439,635, filed on May 16, 2003, and titled "Method and Apparatus for Flexible Fluid Delivery for Cooling Desired Hot Spots in a Heat Producing Device," which is hereby incorporated by reference.

Figure 6A:
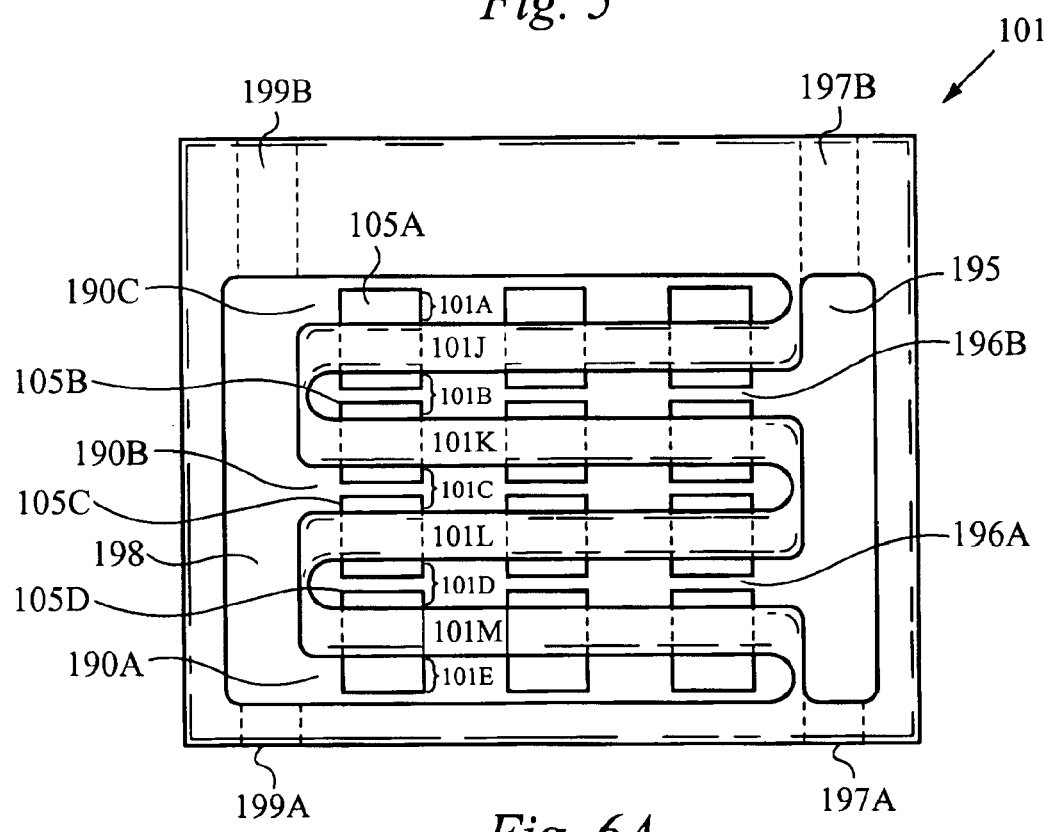
FIG. 6A is a top cross-sectional view of the manifold layer and the interface layer of FIG. 4, showing how the narrowing trenches of the interface layer align with the fingers and the solid portions of the manifold layer.

FIG. 6A is a top cross-sectional view of the manifold layer 101 aligned over the interface layer 105. When the manifold layer 101 is aligned over the interface layer 105, the two define a plurality of apertures 101A–E, as illustrated, for example, in FIG. 1A. For example, as illustrated in FIGS. 6A and 1, the solid portion 101J overlies and spans a portion of the narrowing trench 105D, defining the apertures 10A and 101B; the solid portion 101K overlies and spans a portion of the narrowing trench 105B, defining the apertures 101B and 101C; the solid portion 101L overlies and spans a portion of the narrowing trench 105C, defining the apertures 101C and 101D; and the solid portion 101M overlies and spans a portion of the narrowing trench 105D, defining the apertures 101D and 101E. FIG. 6A also illustrates the dashed line segment TT' shown in FIG. 4.

Figure 6B:
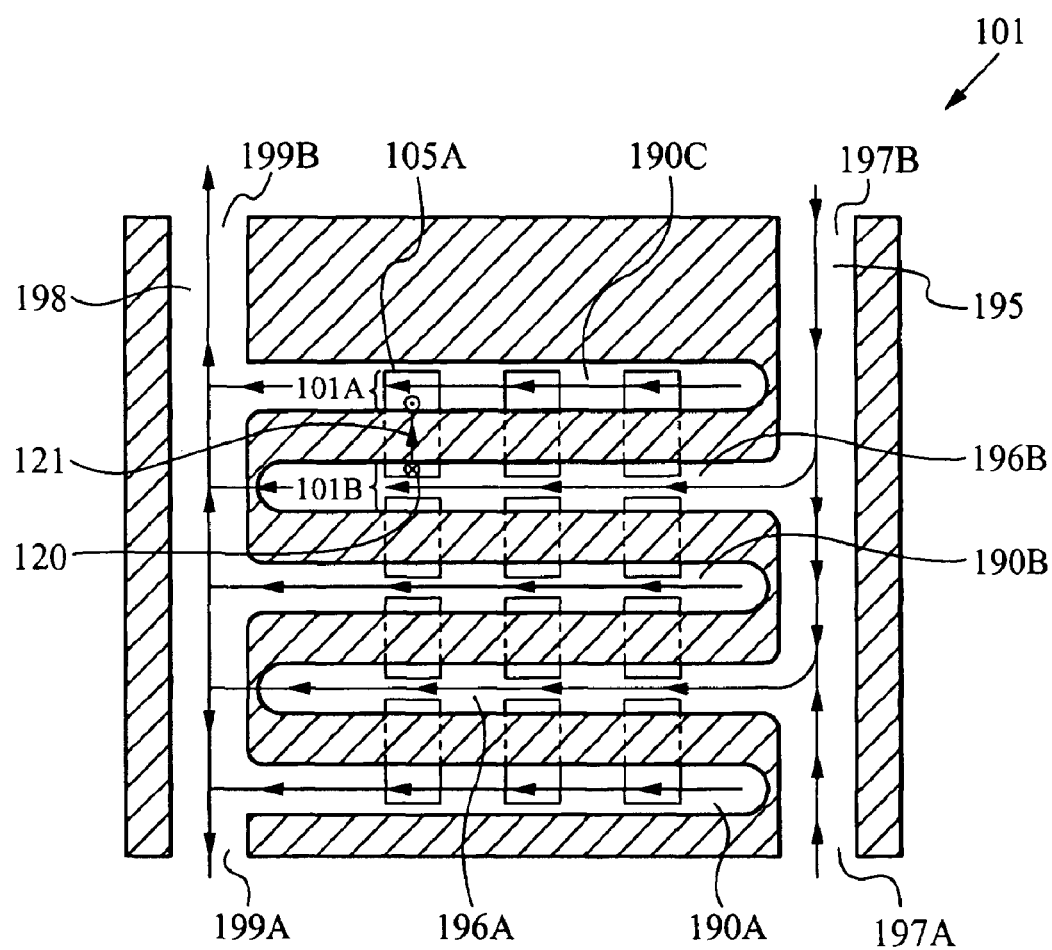
FIG. 6B is a top cross-sectional view of the manifold layer and the interface layer of FIG. 6A, showing flow paths for a cooling material.

FIG. 6B illustrates flow paths along the manifold layer 101 of FIG. 6A for the heat exchanger 300 shown in FIG. 4. To simplify the present discussion, only the two flow paths 120 and 121 from FIG. 1B are described in FIG. 6B. As illustrated in FIG. 6B, a cooling material is introduced into the inlet ports 197A–B by, for example, a pump (not shown). The cooling material then flows into the first reservoir 195 and then into the hollow finger 196B. Referring now to FIGS. 1B and 6B, the cooling material travels along the hollow finger 196B and down into the aperture 101B along the flow path 120. The "$\hat{x}$" marking the flow path 120 in FIG. 6B indicates that the cooling material travels into the plane of the drawing and thus into the aperture 101B. The cooling material next travels within the channel defined by the narrowing trench 105A along the flow path 121 and out the aperture 101A. The "$\odot$" marking the flow path 121 in FIG. 6B indicates that the cooling material travels out of the plane of the drawing and thus into the aperture 10A and into the hollow finger 190C. It will be appreciated that phrases such as "into" and "out of" used herein are used to help describe the direction of flow in reference to the drawings and are not intended to limit the scope of the present invention. Next, the cooling material traveling along the hollow finger 190C flows to the reservoir 198 and to the outlet ports 199A–B. From here, the cooling material can be removed from the heat exchanger 300 or cooled and reintroduced to the inlet ports 197A–B.

It will be appreciated that the cooling material introduced to the inlet ports 197A–B can and generally does travel along hollow fingers in addition to the hollow fingers 196B and 190C. The present discussion is limited to cooling material traveling along the hollow fingers 196B and 190C only to simplify the present description. Along the hollow finger 196B, the cooling material can and generally is introduced into apertures other than the aperture 101B. Along the aperture 101B, the cooling material can and generally does travel along paths other than the flow path 121, as illustrated in FIG. 6B. For example, the cooling material traveling along the flow path 120 can be divided with a portion traveling along the flow path 122, as illustrated in FIG. 1B. As described in more detail below, the heat exchanger 300 can also comprise an intermediate layer that determines which apertures the cooling material is introduced into, thus controlling the flow of cooling material above a heat-generating source.

Figure 7:
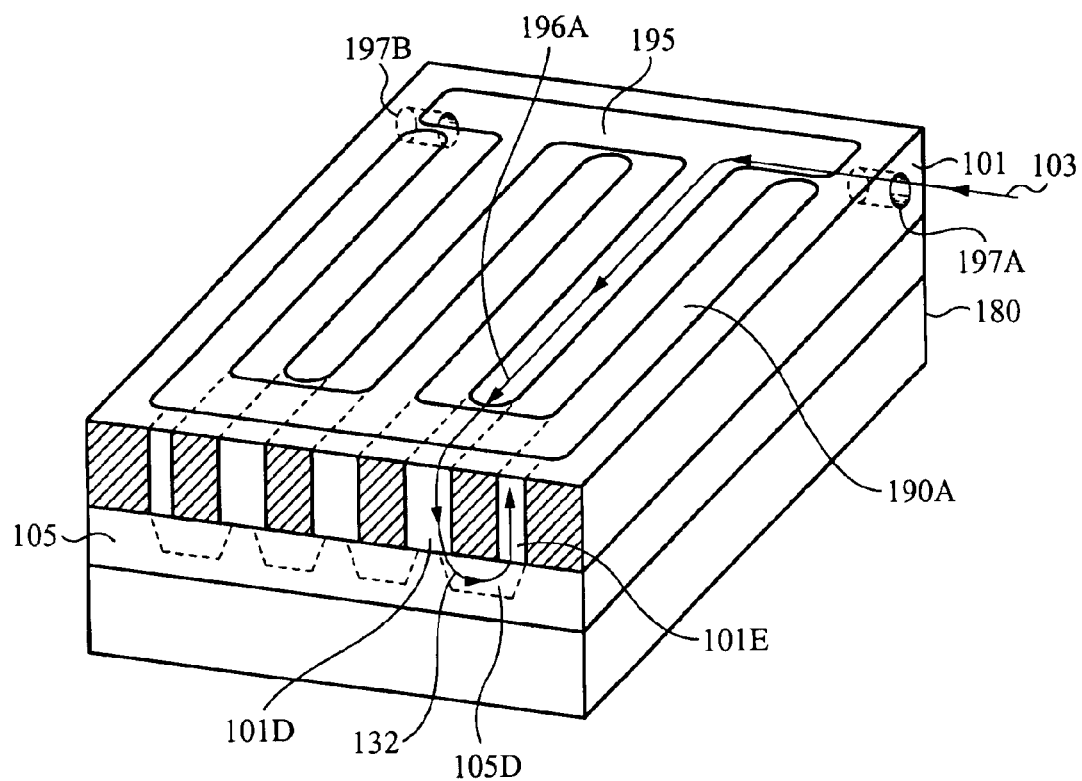
FIG. 7 is a perspective view of the manifold layer and the interface layer of FIG. 6B, again showing a flow path.

FIG. 7 illustrates a section of the heat exchanger 300 of FIG. 4, with the top surface 189 removed. FIG. 7 shows that section of the heat exchanger 300 of FIG. 4 delimited by the plane RR'SS' and containing the first reservoir 195. The plane RR'SS' intersects the hollow fingers 190, the hollow fingers 196, the solid portions 101J–M, and the narrowing trenches 105A–D, all shown in FIG. 4. FIG. 7 is used to describe a three-dimensional flow path for a portion of a cooling material 103.

As illustrated in FIG. 7, the cooling material 103 is introduced into the inlet port 197A, into the reservoir 195, along the hollow finger 196A, down to the aperture 101D, along the flow path 132 through the narrowing trench 105D, up to the aperture 101E, and up through the hollow finger 190A. The cooling material then flows in a direction out of and perpendicular to the page. Referring to FIG. 4, the cooling material then flows into the second reservoir 198 and out one or both of the outlet ports 199A and 199B. Again referring to FIG. 7, while traveling along the flow path 132, the cooling material absorbs heat generated by the heat-generating source 180 and conducted by that portion of the interface layer 105 substantially adjacent to the narrowing trench 105D. The cooling material carries the absorbed heat away from the heat-generating source 180, thus cooling the heat-generating source 180 at a location adjacent to the narrowing trench 105D. The cooling material circulating in the other narrowing trenches 105A–C cools the heat-generating source 180 in a similar manner at locations adjacent to the narrowing trenches 105A–C.

Figure 8:
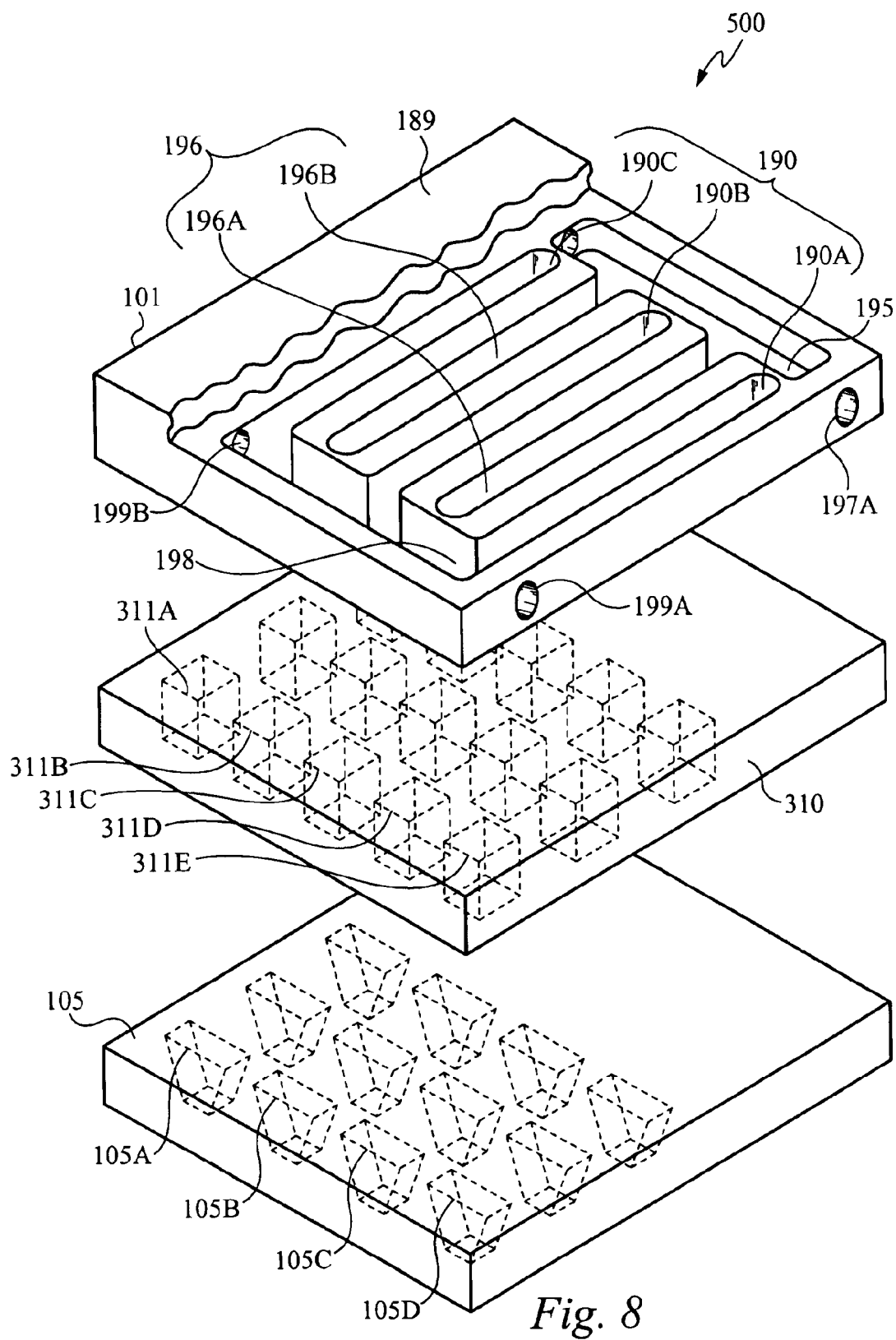
FIG. 8 is a perspective view of the manifold layer of FIG. 4, an intermediate layer, and the interface layer of FIG. 4, together forming a heat exchanger in accordance with the present invention.

It will be appreciated that heat exchangers in accordance with the present invention can have many alternative configurations. For example, FIG. 8 illustrates a heat exchanger 500 comprising the manifold layer 101 and interface layer 105, both of FIG. 4, with an intermediate layer 310 positioned between the manifold layer 101 and the interface layer 105. As in FIG. 4, FIG. 8 shows the manifold layer with a portion of the top surface 189 cut away. The intermediate layer 310 can be used, for example, to allow cooling material to flow only into those channels that are above hot spots and to prevent cooling material from flowing into those channels that are not above hot spots. Thus, less cooling material is required and less energy is required for a pump circulating the cooling material.

Figure 9:
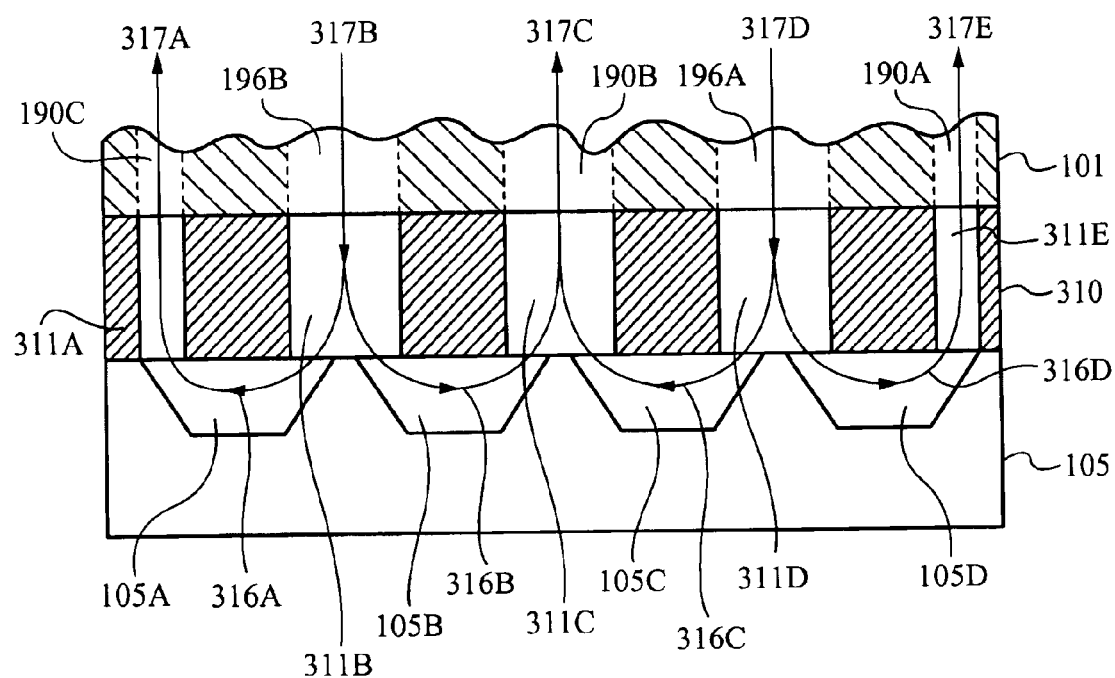
FIG. 9 is a side cross-sectional view of the heat exchanger of FIG. 8, showing several flow paths.

As illustrated in FIG. 8, the intermediate layer 310 has a plurality of apertures 311A–E, used to control the flow of the cooling material from the manifold layer 101 to the interface layer 105. While FIG. 9 depicts one row of apertures 311A–E, it will be appreciated that the intermediate layer 310 can and generally does contain more than one row of apertures. FIG. 9 depicts one row of apertures to simplify the present discussion. The use of the intermediate layer 310 in accordance with the present invention is described in relation to FIG. 9.

FIG. 9 is a side cross-sectional view of a section of the manifold layer 101, the intermediate layer 310, and the interface layer 105 of FIG. 8. As illustrated in FIG. 9, the aperture 311A is positioned between the hollow finger 190C and the narrowing trench 105A; the aperture 311B is positioned between the hollow finger 196B and the narrowing trenches 105A and 105B; the aperture 311C is positioned between the hollow finger 190B and the narrowing trenches 105B and 105C; the aperture 311D is positioned between the hollow finger 196A and the narrowing trenches 105C and 105D; and the aperture 311E is positioned between the hollow finger 190A and the narrowing trench 105D. In this way, the cooling material traveling along the flow path 317B is introduced into the hollow finger 196B and along the flow paths 316A and 316B. The cooling material traveling along the flow path 316A travels through the aperture 311A and into the hollow finger 190C. The cooling material traveling along the flow path 316B travels through the aperture 311C and into the hollow finger 190B.

Similarly, the cooling material traveling along the flow path 317D is introduced into the hollow finger 196A and along the flow paths 316C and 316D. The cooling material traveling along the flow path 316C travels through the aperture 311C and into the hollow finger 190B. The cooling material traveling along the flow path 316D travels through the aperture 311E and into the hollow finger 190A. Thus, as described below, by opening or closing the apertures 311A–C, the flow of cooling material through the heat exchanger 500 can be controlled.

Figure 10:
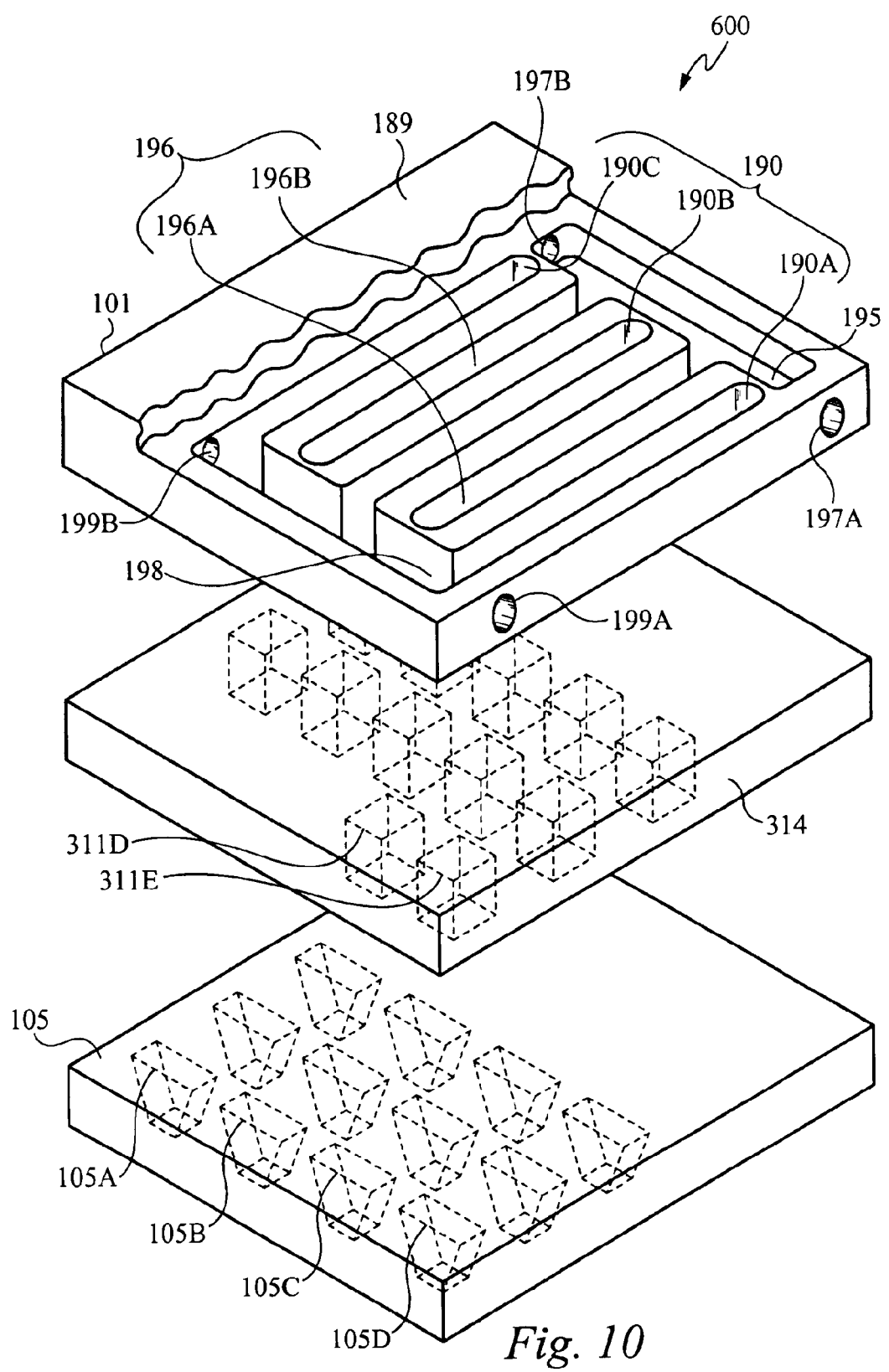
FIG. 10 is a perspective view of a manifold layer of FIG. 4, an intermediate layer, and the interface layer of FIG. 4, together forming a heat exchanger in accordance with the present invention.
Figure 11:
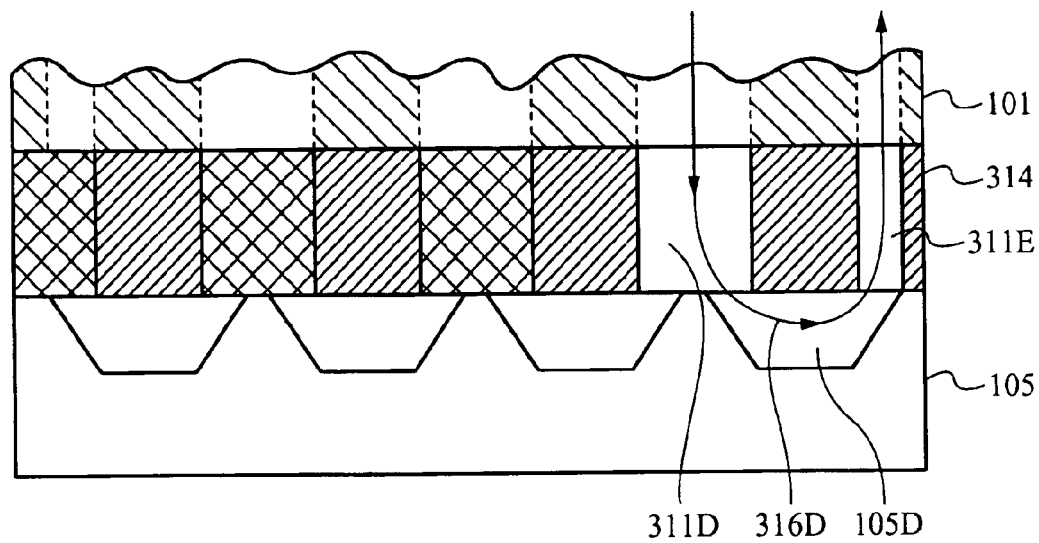
FIG. 11 is a side cross-sectional view of the heat exchanger of FIG. 10, showing a flow path.

FIG. 10 shows a heat exchanger 600 having the manifold layer 101, the interface layer 105, both of FIG. 8, and an intermediate layer 314 positioned between the manifold layer 101 and the interface layer 105. The intermediate layer 314 is configured to allow cooling material to flow only along the flow path 316D (FIG. 11). As in FIGS. 4 and 8, FIG. 10 shows the manifold layer 101 with a portion of the top surface 189 cut away. The intermediate layer 314 has the apertures 311D and 311E, but not the apertures 311A–C as shown in FIG. 8. Thus, as illustrated in FIG. 11, the cooling material is controlled to flow only along the flow path 316D and not along the flow paths 316A–C. Intermediate layers such as the intermediate layer 314 are useful, for example, when a heat-generating source (not shown) coupled to a bottom surface of the interface layer 105 has non-uniform heat-generating portions. In one example, the heat-generating source needs to be cooled only below the narrowing trench 105D and thus below the flow path 316D. Intermediate layers such as that described here are taught, for example, in U.S. patent application Ser. No. 10/439,635, filed on May 16, 2003, and titled "Method and apparatus for Flexible Fluid Delivery for Cooling Desired Hot Spots in a Heat Producing Device," incorporated by reference above.

Figure 12A:
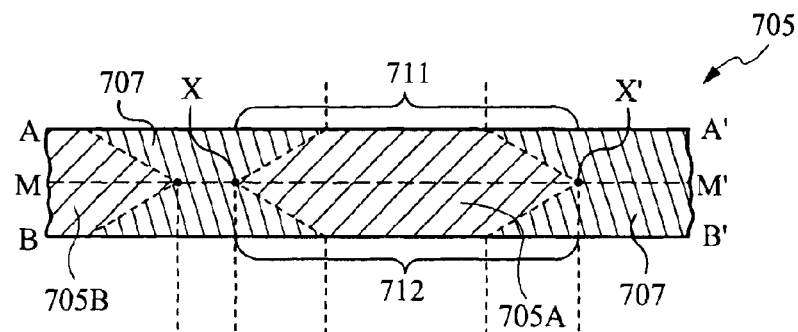
FIG. 12A is a top view of an interface layer in accordance with one embodiment of the present invention.
Figure 12B:
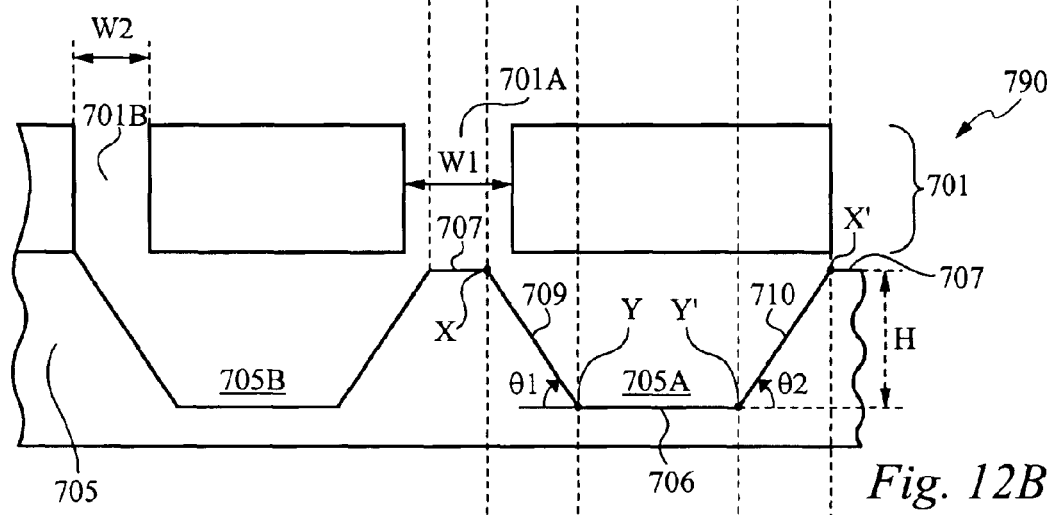
FIG. 12B is side cross-sectional view of the interface layer of FIG. 12A and a manifold layer aligned with the interface layer, in accordance with the present invention.
Figure 12C:
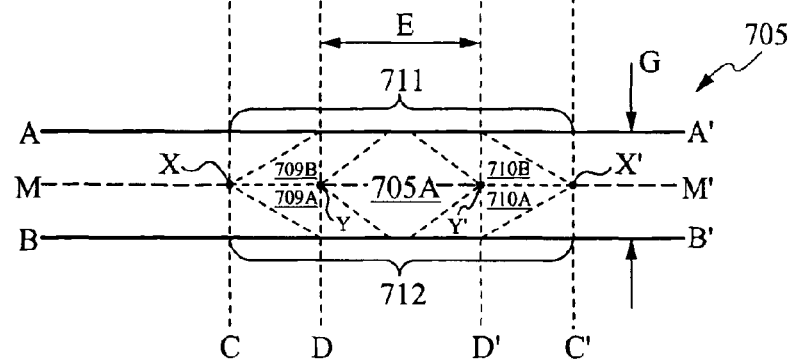
FIG. 12C is more detailed top view of the interface layer of FIG. 12A.

FIGS. 12A–C are used to show features of a portion of a heat exchanger 790 in accordance with one embodiment of the present invention. FIGS. 12A–C show, respectively, a top view of an interface layer 705, a side cross-sectional view of a heat exchanger 790 formed from the interface layer 705 and a manifold layer 701, and a more detailed top view of the interface layer 705.

FIG. 12A illustrates that the interface layer 705 has top surface 707 and narrowing trenches 705A and 705B. As illustrated in FIG. 12A, the narrowing trench 705A has a first vertical edge wall 711 delineated by the line AA' and a second vertical edge wall 712 delineated by the line BB'. The line MM' bisects the interface layer 705 and is used below to describe features of the interface layer 705. As described in more detail below, in the discussion of FIG. 12C, the narrowing trench 705A comprises two sloping sidewall sections 709 and 710, each of which comprises two sloping sidewalls (709A and 709B, and 710A and 710B, respectively).

FIG. 12B is a cross-sectional view of the heat exchanger 790, in accordance with one embodiment of the present invention. FIG. 12B illustrates a cross section of the interface layer 705 of FIG. 12A, taken along the line MM', and a cross-section of the manifold layer 701. The manifold layer 701 comprises an aperture 701A with a width W1 and an aperture 701B with a width W2. The narrowing trench 705A has a height H measured from a point X on the top surface 707 of the narrowing trench 705A to a point Y on a flat bottom surface 706 of the narrowing trench 705A. In the cross section shown, the narrowing trench 705A has a first sloping sidewall section 709 that extends from the point X to the point Y. Similarly, the narrowing trench 705A has a second sloping sidewall section 710 that extends from a point X' on the top surface 707 of the narrowing trench 705A to a point Y' on the bottom surface 706.

FIG. 12B further illustrates that the sloping sidewall section 709 (and thus, as described below, each of the sidewalls 709A and 709B that form the sidewall section 709) makes an angle $\theta 1$ with the bottom surface 706, measured clockwise from the bottom surface 706. The sidewall section 710 makes an angle $\theta 2$ with the bottom surface 706, measured counterclockwise from the bottom surface 706. Preferably, both $\theta 1$ and $\theta 2$ are between 0 degrees and 90 degrees. Also, preferably, $\theta 1$ equals $\theta 2$.

Referring now to FIG. 12C, the sloping sidewall section 709 (FIG. 12B) is comprised of two sloping sidewalls 709A and 709B angled to each other. Each of the sloping sidewalls 709A and 709B makes the angle $\theta 1$ with the bottom surface 706, measured clockwise from the bottom surface 706. The sloping sidewall section 710 (FIG. 12B) is comprised of two sloping sidewalls 710A and 710B angled to each other. Each of the sidewalls 710A and 710B makes the angle $\theta 2$ with the bottom surface 706, measured counterclockwise from the bottom surface 706. As illustrated in FIG. 12C, the line MM' bisects the heat exchanger 790, intersecting the sloping sidewall section 709 where the sloping sidewall 709A meets the sidewall 709B and where the sloping sidewall 710A meets the sloping sidewall 710B.

Still referring to FIG. 12C, the narrowing trench 705A has a width G, the distance between the lines AA' and BB'. A length of the bottom surface 706 along the cross section MM', delimited by the line segment DD', has a length E. A width of an upper portion of the narrowing trench 705A along the line MM', delimited by the line segment CC', has a length V.

In a preferred embodiment, the height H is approximately 1 mm, the widths W1 and W2 are both approximately 200 µm, the width G is approximately 20 µm, the length E is approximately 2 mm, and the length V is approximately 3.4 mm. It will be appreciated that in accordance with the present invention, H can be larger or smaller than 1 mm, one or both of W1 and W2 can be larger or smaller than 200 µm, G can be larger or smaller than 20 µm, and E can be larger or smaller than 2 mm. It will also be appreciated that the dimensions of the trench 705B can differ from those of the trench 705A; the dimensions of both are depicted as similar merely for ease of illustration. Preferably, H is chosen large enough to provide structure for the heat exchanger 790 and to withstand the heat generated by a heat-generating source coupled to the heat exchanger 790. Preferably, H is also small enough to allow heat to radiate quickly and efficiently to a cooling material circulating in the channels of the heat exchanger 790. In one embodiment, the above values are chosen to provide aspect ratios for the narrowing trenches of 10:1 or larger. It will be appreciated, however, that the dimensions can also be chosen to provide depth:width aspect ratios smaller than 10:1.

FIGS. 13A–D depict steps used to fabricate a narrowing trench (and thus a channel) and a portion of a manifold layer, in accordance with one embodiment of the present invention. While FIGS. 13A–D depict the formation of one narrowing trench, it will be appreciated that by using appropriate masks, the steps illustrated in FIGS. 13A–D can be used to form a plurality of narrowing trenches in accordance with the present invention.

Figure 13A:
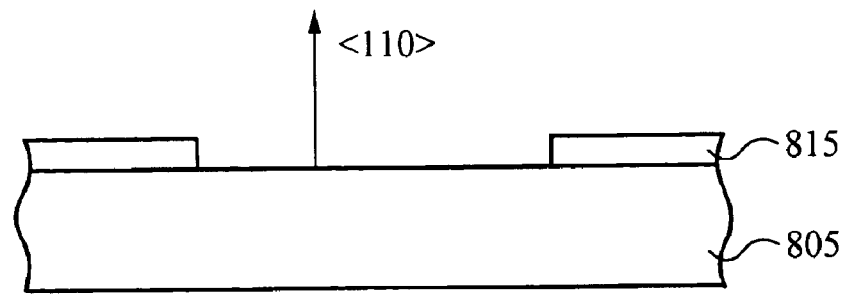
FIGS. 13A–D show the steps used to form an interface layer, in accordance with the present invention.

FIG. 13A illustrates a material 805 having a <110> orientation with a mask 815 formed or deposited over a surface of the material 805. The mask 815 is patterned using, for example, photo-lithographic processes to expose areas that will later define the narrowing trenches. The material 805 exhibits anisotropic etching, as described below. Preferably, the material 805 is <110> oriented silicon. It will be appreciated that etching <110> oriented silicon will expose <111> oriented sidewalls of the silicon. Alternatively, the material 805 is any orientation of silicon or any other material or composite of materials that together exhibit anisotropic etching.

Figure 13B:
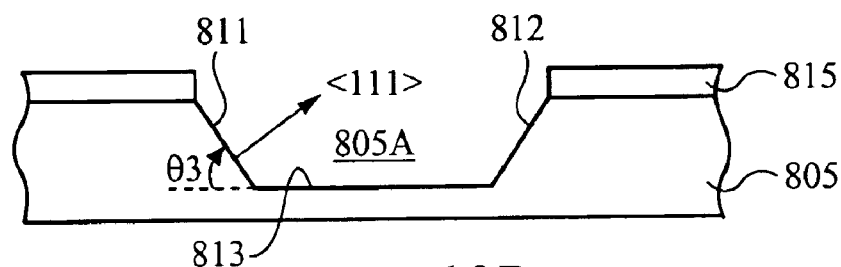

The material 805 is then exposed to an etchant, such as a wet etchant, to expose the <111> oriented planes (i.e., the sidewalls 811 and 812) and a bottom surface 813, as illustrated in FIG. 13B, of the resulting narrowing trench 805A. Alternatively, the material 805 is etched in an anisotropic plasma etch. As illustrated in FIG. 13B, the sloping sidewall 811 makes an angle θ3, measured clockwise from the a bottom surface of the trench 805A, of approximately 54.7 degrees. It will be appreciated that the present invention contemplates sidewalls having other angles with the bottom surface of the trench 805A, angles preferably greater than 0 degrees but less than 90 degrees. The present invention also contemplates forming angled sidewalls within this range by, for example, combining piecewise sections to form an angled sidewall.

Preferably, the mask 815 is formed of a material substantially resistant to the etchant. Etchants used in accordance with the present invention include, but are not limited to, potassium hydroxide (KOH) and tetramethyl ammonium hydroxide (TMAH). Masks used in accordance with the present invention can comprise nitrides, oxides such as $SiO_2$, and some metals.

Figure 13C:
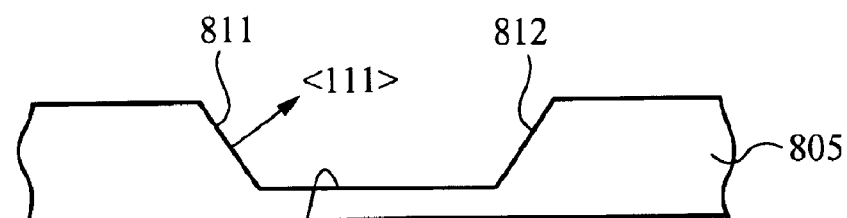
Figure 13D:
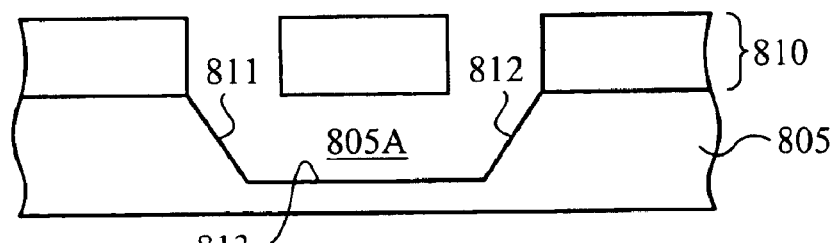

Next, as illustrated in FIG. 13C, the mask 815 is removed, using any of a variety of techniques. Next, as illustrated in FIG. 13D, a manifold layer 810 is coupled to the interface layer 805. The manifold layer 810 can be coupled to the interface layer using a variety of techniques, including adhesive bonding, thermal fusing, anodic bonding, eutectic bonding, or other any other form of bonding. Alternatively, the manifold layer 810 and the interface layer 805 can be formed from a single monolithic device during device fabrication. Preferably, the manifold layer 810 is formed and oriented so that the resulting apertures all lie substantially in a single plane, substantially parallel to the bottom surfaces of the narrowing trenches. The manifold layer 810 can be formed from a variety of materials including, but not limited to, a plastic, a glass, a metal, a semiconductor, and a composite of materials.

Next, the interface layer 805 can be coupled to a heat-generating source, such as a semiconductor device. Alternatively, the heat-generating source can be integrally formed with a bottom surface of the interface layer 805, for example in one or more semiconductor device fabrication steps. A pump (not shown) can then be coupled to the manifold layer 810, as described above, to pump the cooling material through the heat exchanger and thus cool the heat-generating source. The cooling material can comprise a liquid, such as water, a gas, air, a vapor, or a combination of these.

Alternatively, the interface layer 805 can be manufactured from a metal, such as copper, using standard machining processes to form the narrowing trenches. These machining processes can include, but are not limited to, milling, sawing, drilling, stamping, EDM, wire EDM, coining, die casting, investment casting, or any combination of these. Alternatively, the interface layer 805 can be formed by other processes, including, but not limited to, electroplating, metal injection molding, LIGA processes, casting, or any combination of these.

Heat exchangers in accordance with the present invention provide smooth flow paths (channels) in which cooling materials travel. Such structures work more efficiently and thus reduce the load on the pumps pumping the cooling material through the heat exchanger. The method of manufacturing heat exchangers in accordance with one embodiment of the present invention are relatively inexpensive. Materials exhibiting anisotropic etching are chemically etched, preferably using wet chemistries, to form narrowing trenches that ultimately form the flow paths. The use of wet chemistries is inexpensive and quick compared to other device fabrication processes. The present invention can thus be used to inexpensively fabricate heat exchangers used to cool a variety of devices, such as semiconductor devices, motors, batteries, walls of process chambers, or any device that generates heat.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made to the embodiments chosen for illustration without departing from the spirit and scope of the invention.

We claim:

1. A method of forming a heat exchanger, comprising:
   a. forming a manifold layer defining a plurality of apertures;
   b. forming an interface layer comprising one or more narrowing trenches, each aperture positioned on one side of a narrowing trench, whereby a path is defined from a first aperture, through a narrowing trench, and to a second aperture; and
   c. coupling an intermediate layer having a plurality of openings positioned over the plurality of apertures.

2. The method of claim 1, wherein the interface layer comprises a material exhibiting anisotropic etching.

3. The method of claim 2, wherein the material comprises a <110> oriented silicon substrate.

4. The method of claim 3, wherein forming an interface layer comprises etching the <110> oriented silicon substrate in an etchant to produce a <111> oriented surface defining a sloping wall of a narrowing trench.

5. The method of claim 4, wherein the etchant comprises potassium hydroxide (KOH).

6. The method of claim 4, wherein the etchant comprises tetramethyl ammonium hydroxide (TMAH).

7. The method of claim 1, wherein the one or more narrowing trenches are formed by a machining process selected from the group consisting of milling, sawing, drilling, stamping, EDM, wire EDM, coining, die casting, and investment casting.

8. The method of claim 1, wherein the one or more narrowing trenches are formed by a process selected from the group consisting of electroplating, metal injection molding, LIGA processes, and casting.

9. The method of claim 1, wherein the manifold layer and the interface layer are formed of a monolithic device.

10. The method of claim 1, further comprising coupling the manifold layer to the interface layer.

11. The method of claim 10, wherein coupling the manifold layer to the interface layer comprises adhesively bonding the manifold layer to the interface layer.

12. The method of claim 10, wherein coupling the manifold layer to the interface layer comprises thermally fusing the manifold layer to the interface layer.

13. The method of claim 10, wherein coupling the manifold layer to the interface layer comprises anodically bonding the manifold layer to the interface layer.

14. The method of claim 10, wherein coupling the manifold layer to the interface layer comprises eutectically bonding the manifold layer to the interface layer.

15. The method of claim 1, wherein the manifold layer comprises a material selected from the group consisting essentially of a plastic, a glass, a metal, and a semiconductor.

16. The method of claim 1, wherein forming the manifold layer comprises forming a first plurality of interconnected hollow fingers and a second plurality of interconnected hollow fingers, the first plurality of interconnected hollow fingers providing flow paths to the one or more first apertures and the second plurality of interconnected hollow fingers providing flow paths from the one or more second apertures.

17. The method of claim 16, wherein the first plurality of interconnected hollow fingers and the second plurality of interconnected hollow fingers lie substantially in a single plane.

18. The method of claim 16, further comprising coupling a pump to the first plurality of interconnected hollow fingers.

19. The method of claim 1, further comprising coupling a heat-generating source to the interface layer.

20. The method of claim 19, wherein a bottom surface of the interface layer is integrally formed with the heat-generating source.

21. The method of claim 19, wherein the heat-generating source comprises a semiconductor microprocessor.

22. The method of claim 18, further comprising introducing a cooling material to the pump, so that the pump circulates the cooling material along the first plurality of interconnected hollow fingers, to the one or more first apertures, along a plurality of narrowing trenches, to the one or more second apertures, and to the second plurality of interconnected hollow fingers, thereby cooling the heat-generating source.

23. The method of claim 22, wherein the cooling material comprises a liquid.

24. The method of claim 23, wherein the liquid comprises water.

25. The method of claim 22, wherein the cooling material comprises a liquid/vapor mixture.

26. The method of claim 1, wherein each aperture lies substantially in a single plane, parallel to a lower surface of the interface layer.

27. The method of claim 1, wherein the manifold layer comprises a surface that extends into each narrowing trench and substantially conforms to a contour of each narrowing trench.

28. The method of claim 1, wherein a narrowing trench has a depth:width aspect ratio of at least approximately 10:1.

29. The method of claim 1, wherein each of the one or more trenches has a substantially planar floor.

30. A heat exchanger comprising:
a. a manifold layer defining a plurality of apertures;
b. an interface layer comprising a plurality of narrowing trenches, each aperture positioned on one side of a narrowing trench, whereby a path is defined from a first aperture, through a narrowing trench, and to a second aperture; and
c. an intermediate layer having a plurality of openings positioned over the plurality of apertures between the manifold layer and the interface layer.

31. The heat exchanger of claim 30, wherein the interface layer comprises a material exhibiting anisotropic etching.

32. The heat exchanger of claim 31, wherein the material exhibiting anisotropic etching comprises a <110> oriented silicon substrate.

33. The heat exchanger of claim 32, wherein the interface layer is formed by etching the <110> oriented silicon substrate in an etchant to produce a <111> oriented surface defining a sloping wall of a narrowing trench.

34. The heat exchanger of claim 33, wherein the etchant comprises potassium hydroxide (KOH).

35. The heat exchanger of claim 33, wherein the etchant comprises tetramethyl ammonium hydroxide (TMAH).

36. The heat exchanger of claim 30, wherein the narrowing trenches are formed by a machining process selected from the group consisting of milling, sawing, drilling, stamping, EDM, wire EDM, coining, die casting, and investment casting.

37. The heat exchanger of claim 30, wherein the narrowing trenches are formed by a process selected from the group consisting of electroplating, metal injection molding, LIGA processes, and casting.

38. The heat exchanger of claim 30, wherein the manifold layer and the interface layer are formed of a monolithic device.

39. The heat exchanger of claim 30, wherein the manifold layer is coupled to the interface layer.

40. The heat exchanger of claim 39, wherein the manifold layer is coupled to the interface layer by adhesive bonding.

41. The heat exchanger of claim 39, wherein the manifold layer is coupled to the interface layer by thermal fusing.

42. The heat exchanger of claim 39, wherein the manifold layer is coupled to the interface layer by anodic bonding.

43. The heat exchanger of claim 39, wherein the manifold later is coupled to the interface layer by eutectic bonding.

44. The heat exchanger of claim 30, wherein the manifold layer comprises a material selected from the group consisting essentially of a plastic, a glass, a metal, and a semiconductor.

45. The heat exchanger of claim 30, wherein the manifold layer comprises a first plurality of interconnected hollow fingers and a second plurality of interconnected hollow fingers, the first plurality of interconnected hollow fingers providing flow paths to the one or more first apertures and the second plurality of interconnected hollow fingers providing flow paths from the one or more second apertures.

46. The heat exchanger of claim 45, wherein the first plurality of interconnected hollow fingers and the second plurality of interconnected hollow fingers lie substantially in a single plane.

47. The heat exchanger of claim 45, further comprising a pump coupled to the first plurality of interconnected hollow fingers.

48. The heat exchanger of claim 30, further comprising a heat-generating source coupled to the interface layer.

49. The heat exchanger of claim 48, wherein the heat-generating source comprises a semiconductor microprocessor.

50. The heat exchanger of claim 48, wherein the heat-generating source is integrally formed to a bottom surface of the interface layer.

51. The heat exchanger of claim 30, wherein each aperture lies substantially in a single plane, parallel to a lower surface of the interface layer.

52. The heat exchanger of claim 30, wherein the manifold layer comprises a surface that extends into each trench and substantially conforms to a contour of each narrowing trench.

53. The heat exchanger of claim 30, wherein a depth-:width aspect ratio for at least one of the plurality of narrowing trenches is at least 10:1.

54. The heat exchanger of claim 30, wherein each of the one or more narrowing trenches has a substantially planar floor.

55. A method of forming a heat exchanger, comprising:
  a. forming a manifold layer defining a plurality of apertures;
  b. forming an interface layer comprising one or more narrowing trenches, each aperture positioned on one side of a narrowing trench, whereby a path is defined from a first aperture, through a narrowing trench, and to a second aperture; and
  a. coupling an intermediate layer between the manifold layer and the interface layer, the intermediate layer comprising a plurality of openings positioned over the plurality of apertures, thereby controlling the flow of a cooling material to the paths.

56. A heat exchanger comprising:
  a. a manifold layer defining a plurality of apertures;
  b. an interface layer comprising a plurality of narrowing trenches, each aperture positioned on one side of a narrowing trench, whereby a path is defined from a first aperture, through a narrowing trench, and to a second aperture; and
  c. an intermediate layer positioned between the manifold layer and the interface layer, the intermediate layer comprising a plurality of openings positioned over the plurality of apertures, thereby controlling the flow of a cooling material to the paths.

* * * * *

UNITED STATES PATENT AND TRADEMARK OFFICE
CERTIFICATE OF CORRECTION

PATENT NO. : 7,017,654 B2
DATED : March 28, 2006
INVENTOR(S) : Thomas Kenny, Mark McMaster and James Lovette It is certified that error appears in the above-identified patent and that said Letters Patent is hereby corrected as shown below:

<u>Title page,</u>
Item [56], References Cited, U.S. PATENT DOCUMENTS,
add -- 6,221,226 B1     4/2001  Kopf-Sill --.

Signed and Sealed this

Twenty-third Day of May, 2006

JON W. DUDAS
*Director of the United States Patent and Trademark Office*